(12) United States Patent
Zheng et al.

(10) Patent No.: US 8,873,329 B1
(45) Date of Patent: Oct. 28, 2014

(54) PATTERNED MEMORY PAGE ACTIVATION

(71) Applicant: Rambus Inc., Sunnyvale, CA (US)

(72) Inventors: Hongzhong Zheng, Sunnyvale, CA (US); Brent S. Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/741,308

(22) Filed: Jan. 14, 2013

Related U.S. Application Data

(60) Provisional application No. 61/587,483, filed on Jan. 17, 2012.

(51) Int. Cl.
*G11C 8/00* (2006.01)
*G11C 8/08* (2006.01)

(52) U.S. Cl.
CPC .................................. *G11C 8/08* (2013.01)
USPC .............................. 365/230.01; 365/230.06

(58) Field of Classification Search
CPC ..................................... G11C 8/08; G11C 8/10
USPC ........................................ 365/230.01, 230.06
See application file for complete search history.

(56) References Cited

U.S. PATENT DOCUMENTS

| | | | |
|---|---|---|---|
| 6,825,841 B2 | 11/2004 | Hampel et al. | |
| 6,965,540 B2 | 11/2005 | Farrell et al. | |
| 7,793,037 B2 | 9/2010 | Jain et al. | |
| 7,814,294 B2 | 10/2010 | Sato et al. | |
| 8,213,252 B2* | 7/2012 | Kim | 365/207 |
| 2001/0036120 A1* | 11/2001 | Huber | 365/230.01 |
| 2002/0001895 A1* | 1/2002 | Kitamoto et al. | 438/200 |
| 2002/0093864 A1* | 7/2002 | Ooishi | 365/222 |
| 2002/0167848 A1* | 11/2002 | Nikutta | 365/189.07 |
| 2003/0002315 A1* | 1/2003 | Ooishi | 365/63 |
| 2010/0161915 A1 | 6/2010 | Kim et al. | |

OTHER PUBLICATIONS

Hosogaya, Y. et al., "Performance evaluation of parallel applications on next generation memory architecture with power-aware paging method," IEEE International Symposium on Parallel and Distributed Processing, 2008. IPDPS 2008, pp. 1-8, Apr. 14-18, 2008. 8 pages.

* cited by examiner

*Primary Examiner* — Michael Tran
(74) *Attorney, Agent, or Firm* — Charles Shemwell

(57) ABSTRACT

Row activation operations within a memory component are carried out with respect to patterns of storage cells that constitute a fraction of a row and that have been predicted or predetermined to yield a succession of page hits, thus reducing activation power consumption without significantly increasing memory latency. The patterns of activated storage cells may be predicted or predetermined statically, for example, in response to user input or configuration settings that specify activation patterns to be applied in response to memory request traffic meeting various criteria, or dynamically through run-time evaluation of sequences of memory access requests.

19 Claims, 11 Drawing Sheets

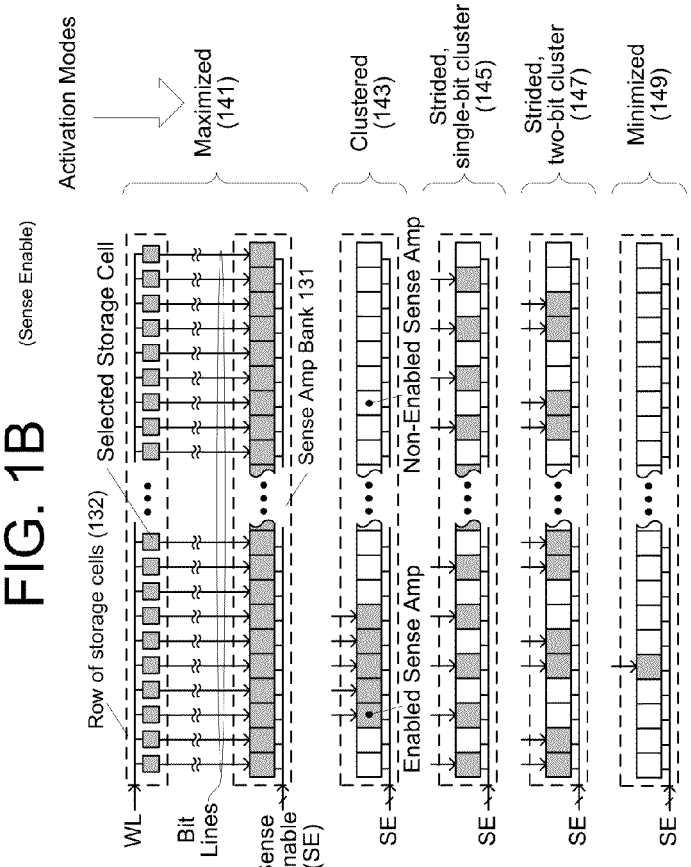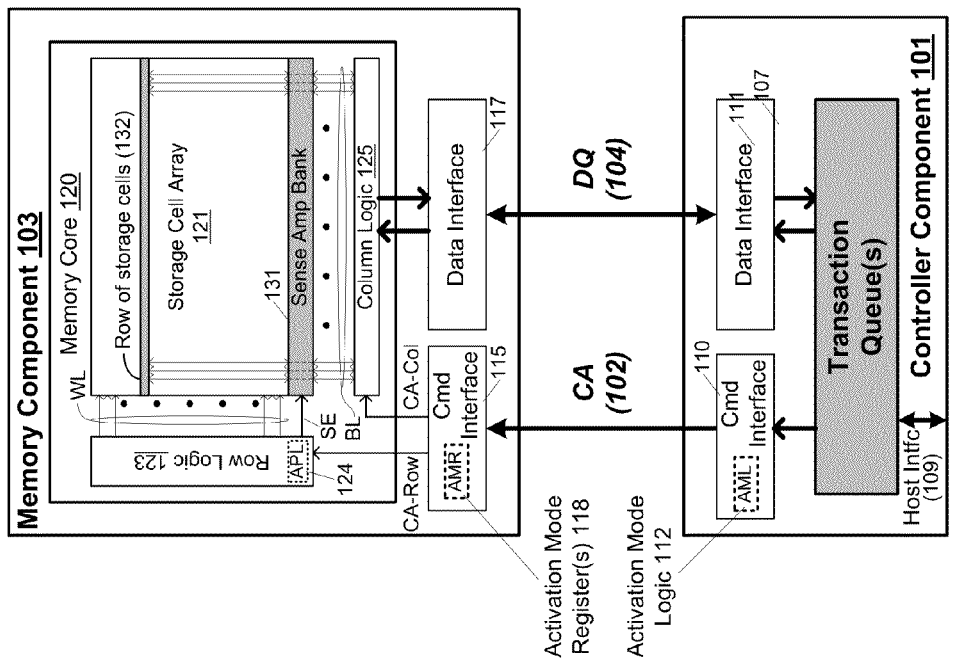
FIG. 1A
FIG. 1B

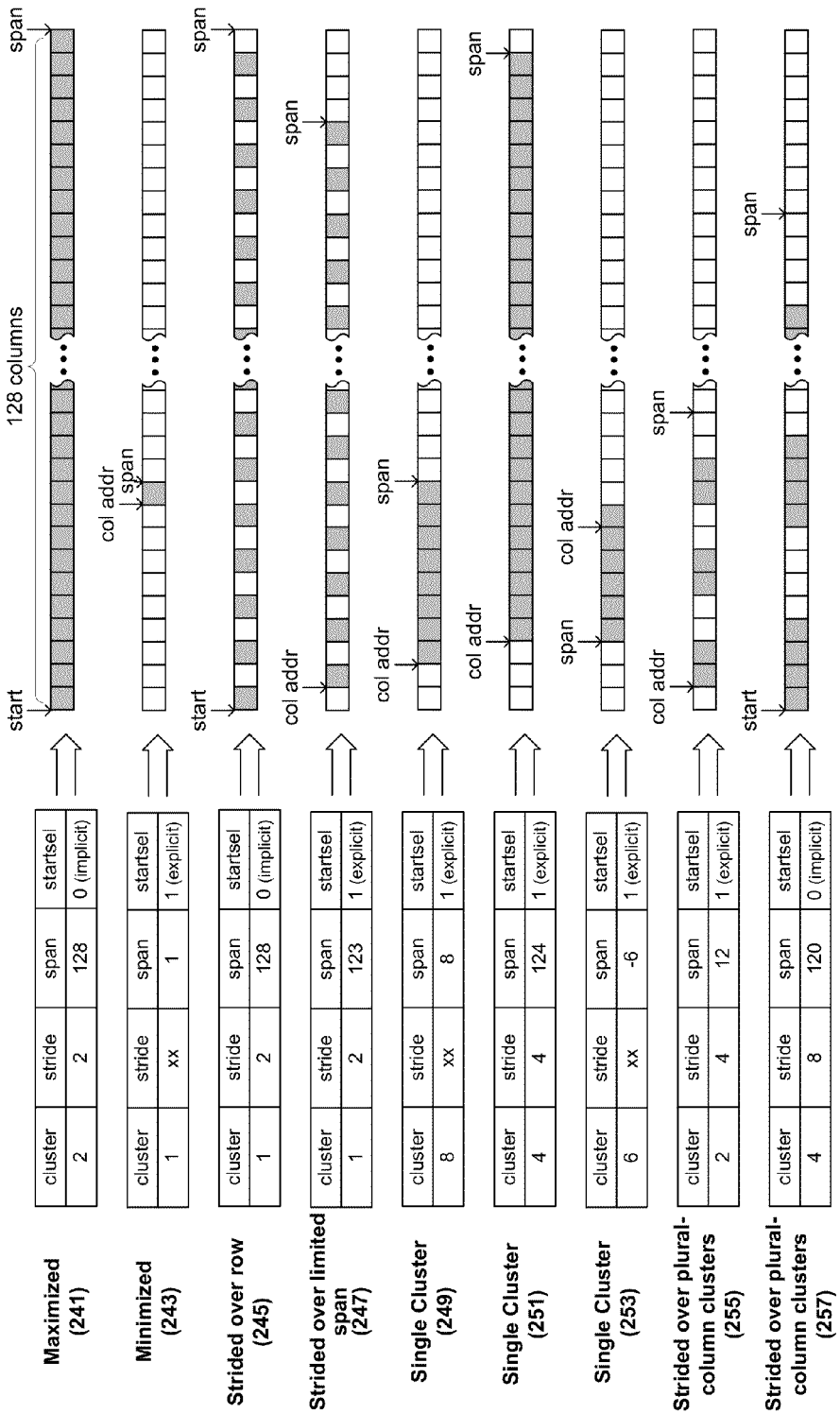

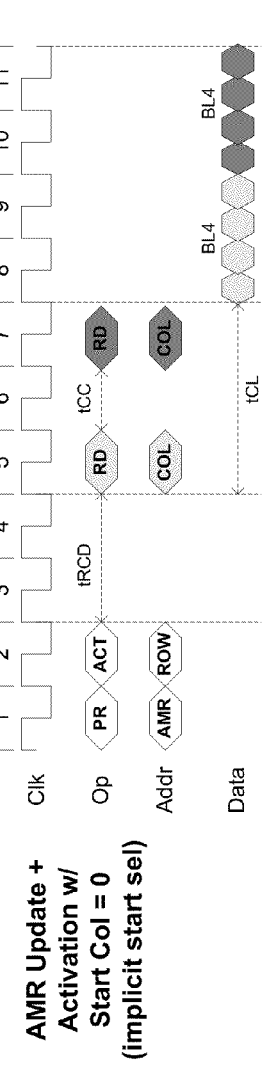
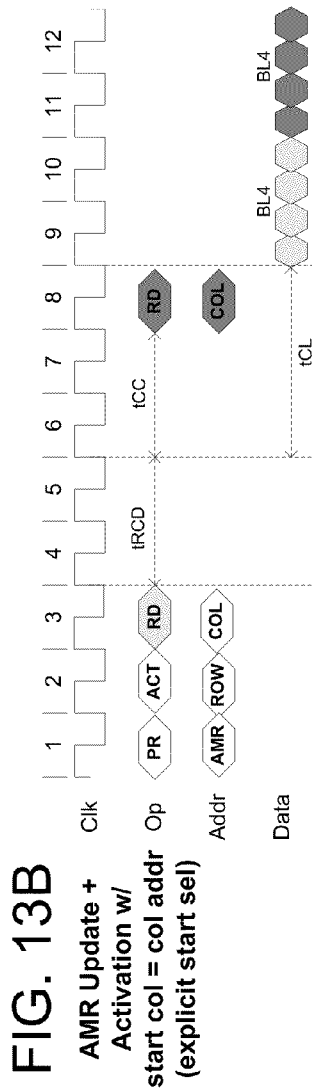
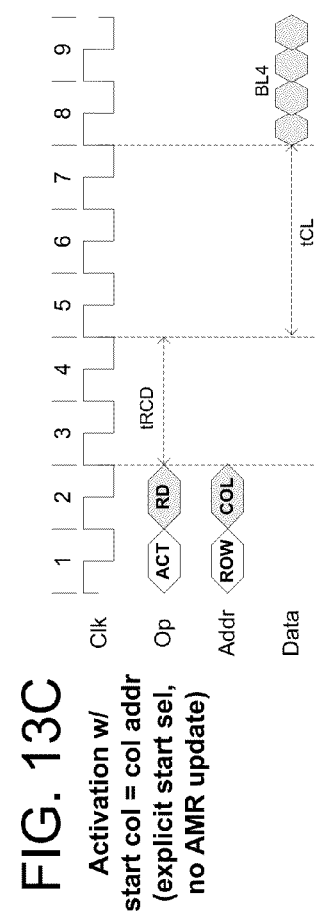
FIG. 13A
AMR Update + Activation w/ Start Col = 0 (implicit start sel)
FIG. 13B
AMR Update + Activation w/ start col = col addr (explicit start sel)
FIG. 13C
Activation w/ start col = col addr (explicit start sel, no AMR update)

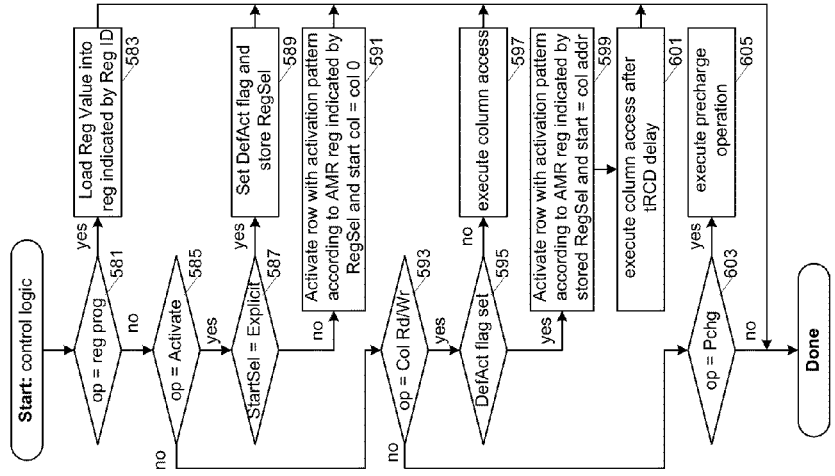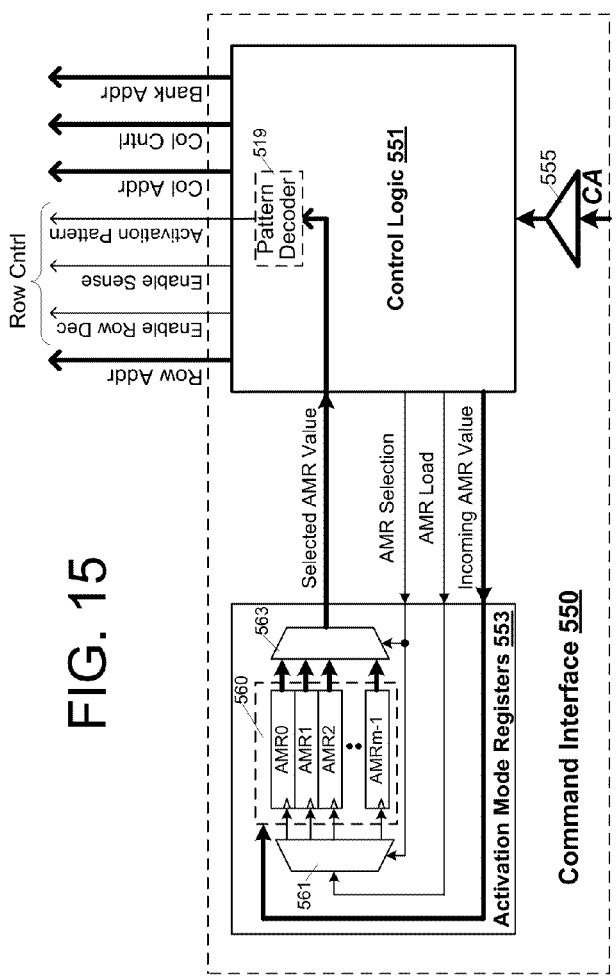

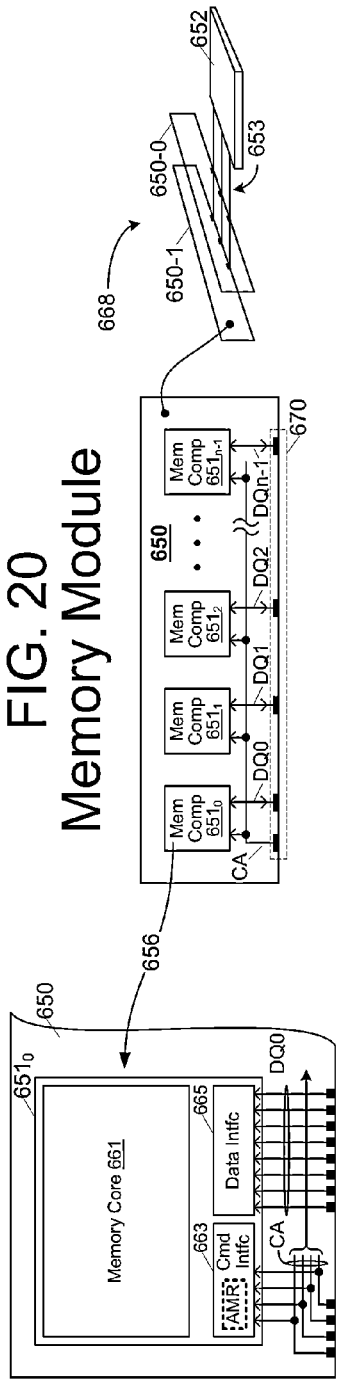
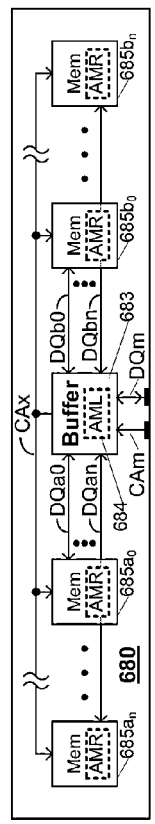
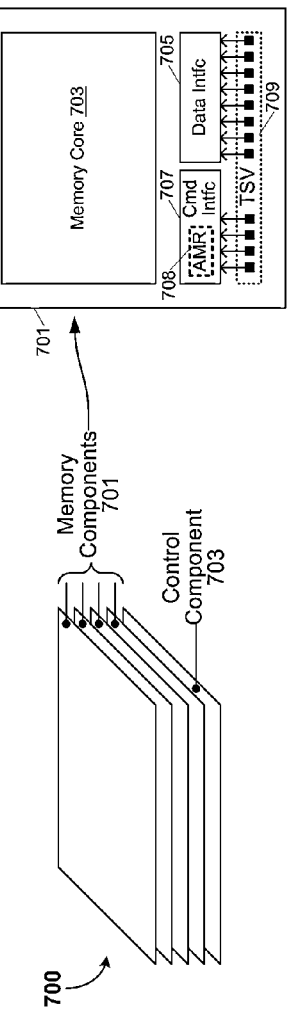
FIG. 20 Memory Module
FIG. 21 Buffered Memory Module
FIG. 22 Die-Stack

US 8,873,329 B1

PATTERNED MEMORY PAGE ACTIVATION

TECHNICAL FIELD

The present disclosure relates generally to the field of integrated circuits, and more particularly to memory access operations within integrated-circuit memory devices.

BACKGROUND

Storage arrays within integrated-circuit memory components are typically accessed in two phases. First, an address-specified page of data is transferred from a row of storage cells to a bank of sense amplifiers in a row activation operation. Thereafter, one or more column read or write operations are executed to access address-specified columns of the page of data within the sense amplifier bank, reading or writing column data within the open page.

Row activation tends to be particularly time consuming, as signals representative of data within individual storage cells are sensed via long, high-capacitance bit lines. To mitigate this timing bottleneck, memory cores have traditionally been architected with relatively high number of columns per row to increase the likelihood that a sequence of memory access requests will "hit" the same open page (i.e., exploiting spatial/temporal locality), and thus enable multiple relatively low-latency column operations per row activation. Unfortunately, the power expended to activate a given storage row is largely wasted as the vast majority of the data transferred to the sense amplifiers during row activation remains untouched in ensuing column operations.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1A illustrates a controller component and memory component having activation mode logic and activation mode registers, respectively, to enable patterned, fractional row memory page row activation;

FIG. 1B illustrates examples of patterned page activation modes that may be executed within the memory component of FIG. 1A;

FIG. 6 illustrates examples of activation patterns that may be achieved by specific settings within the activation mode register fields of FIG. 5;

FIGS. 13A-13C illustrate timing differences between row activation operations having implicitly and explicitly addressed row activation patterns, and between row activation operations that involve and do not involve an activation mode register update;

FIG. 15 illustrates a more detailed embodiment of a command interface that may be used to implement the command interface within the memory component of FIG. 14;

FIG. 16 illustrates exemplary command formats corresponding to commands that may be decoded and operated upon by the control logic of FIG. 15;

FIG. 17 illustrates an exemplary register ID encoding that enables specification of one of multiple bank activation mode registers, a default activation mode register, and a number of additional registers;

FIG. 18 illustrates an exemplary sequence of operations carried out in by the control logic of FIG. 15 in response to incoming commands formatted as shown in FIG. 16;

FIGS. 20-22 depict exemplary memory systems and structures in which control and memory components according to the embodiments above may be deployed.

DETAILED DESCRIPTION

Figure 3:
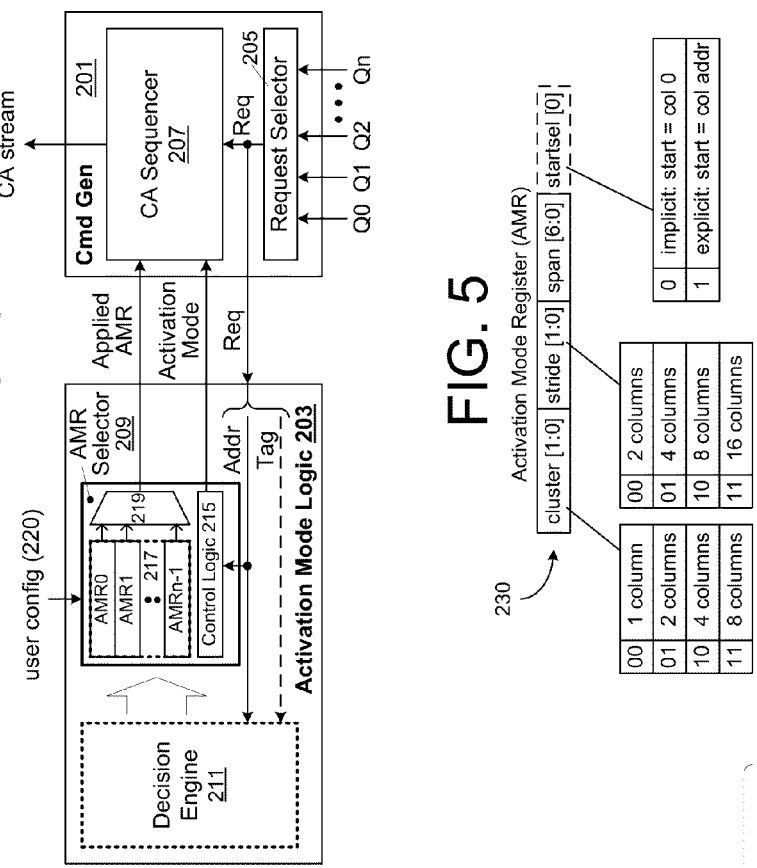
FIG. 3 illustrates more detailed embodiments of a command generator and activation mode logic that may be used to implement the command interface shown in the controller component of FIG. 2.

In embodiments disclosed herein, row activation operations within a memory component are carried out with respect to patterns of storage cells that constitute a fraction of a row and that have been predicted or predetermined to yield a succession of page hits, thus reducing activation power consumption without significantly increasing memory latency. The patterns of activated storage cells ("activation patterns") may be predicted or predetermined statically, for example, in response to user input or configuration settings that specify activation patterns to be applied in response to memory request traffic meeting various criteria, or dynamically through run-time evaluation of sequences of memory access requests. In a number of embodiments, a controller component issues register programming commands to a memory component specifying activation patterns to be programmed within the memory component and applied with respect to subsequently issued row activation commands. In other embodiments, the activation pattern to be applied in a given row activation operation may be specified within the corresponding row activation command instead of being pre-programmed within the memory component.

FIG. 1A illustrates a controller component 101 and memory component 103 having activation mode logic 112 ("AML") and activation mode register circuitry 118 ("AMR"), respectively, to enable patterned memory row activation. More specifically, instead of indiscriminately activating entire rows of storage cells (i.e., all storage cells encompassed by an incoming row address), the controller component 101 and memory component 103 include circuitry to enable run-time selection and application of various activation patterns and thus activation of different combinations of storage cells within a specified row. In a number of embodiments, the activation patterns are selected during system operation according to statically or dynamically generated predictions as to the combinations of activated cells that will yield the highest number of page hits per quantum of activation energy, an efficiency metric referred to herein as "activation economy." In other embodiments, the activation patterns are selected during system operation based on evaluation of memory access requests pending execution (and, optionally, based additionally on completed or in-progress memory access transactions). Further, embodiments may be generally categorized according to characteristics of their core storage technologies, and more specifically according to whether storage cell selection (i.e., enabling the content of a storage cell onto a bit line, for example, by asserting the word line or sub-word line coupled to the access transistor(s) of the cell) destroys the cell content.

In general, the core storage technology within the memory component of FIG. 1A and a number of embodiments that follow are characterized by non-destructive cell selection, while other embodiments, such as DRAM embodiments, are characterized by destructive cell selection. In destructive cell-selection embodiments, different activation patterns may be achieved by establishing a desired cell selection pattern (e.g., providing logic to limit the selected storage cells to those specified by activation pattern signals) and also by controlling which of the sense amplifiers within the sense amplifier bank are enabled to sense and latch data (i.e., limiting the enabled sense amplifiers to those which correspond to the selected cells and thus to the chosen activation pattern). By contrast, in non-destructive cell-selection embodiments (a characteristic of many emerging memory types including, without limitation, resistive random-access memory (RRAM), spin-transfer torque magneto-resistive random-access memory (STT-MRAM), conductive bridging random-access memory (CBRAM), and so forth), the entire row of cells may be selected (i.e., without regard to the activation pattern), with the activation pattern being effected by limiting the enabled sense amplifiers to those corresponding to storage cells of interest.

FIG. 1B illustrates examples of patterned page activation modes that may be executed within the memory component of FIG. 1A. In the non-destructive cell-selection example shown, all the storage cells within a row of storage cells 132 coupled to a given word (WL) line are selected when the word line is asserted, thus enabling data from each storage cell onto the bit line (or pair of bit lines) that couple the storage cell to a respective sense amplifier within sense amplifier bank 131. To establish desired activation patterns, sense-enable signals (SE) provided to respective sense amplifiers within bank 131 are asserted in various combinations, thereby enabling data of interest within the selected row of storage cells to be sensed and latched within enabled sense amplifiers while refraining from sensing/latching unwanted data. In the exemplary activation modes shown, a "maximized" activation pattern 141 is effected by asserting all sense-enable signals, thus activating all storage cells in the row. By contrast, a "clustered" activation pattern 143 is established by asserting sense-enable signals coupled to a cluster of sense amplifiers (i.e., sense amplifiers coupled to adjacent or immediate-neighbor bit lines) and deasserting sense-enable signals coupled to one or more sense amplifiers disposed to the left and/or right of the cluster. A "strided" activation pattern is established by asserting and deasserting sense-amp enable signals corresponding to bit-positions at regular intervals. For example, a bit-strided activation pattern 145 (i.e., strided with single-bit clusters) may be established by asserting every other sense-enable signal and a multi-bit-cluster strided activation pattern 147 (i.e., strided with two or more bits per cluster) may be established by alternately asserting and deasserting groups of two or more sense-enable signals. A minimized activation pattern 149, which may be viewed as a special case of a clustered activation pattern, may be established by asserting a solitary sense-amp enable signal. As discussed below, numerous other activation patterns may be achieved within the embodiment of FIG. 1A and other embodiments presented herein.

In the embodiment of FIG. 1A, controller component 101 and memory component 103 are implemented in respective integrated circuit dies and coupled to one another via command/address signaling links 102 (CA) and data signaling links 104 (DQ). The dies may be separately packaged and interconnected via printed circuit board traces, cables, package-to-package interconnects (as in the case of a package-on-package (POP) arrangement) or any other electrical signal interconnects, or they may be packaged together, for example, in a three-dimensional IC, system in package (SIP), system on chip (SOC) or the like with the die to die signaling links formed by wire-bonds, through-silicon-vias (TSVs), die-to-die cables or other in-package interconnects. In other embodiments, the controller and memory components may be implemented in the same integrated die with the signaling links established by on-chip conductive structures (e.g., poly lines, metal-layer interconnects, etc.). Also, whether implemented in the same die or separate dies, additional signal interconnects beyond the CA and DQ links may be provided and/or either the CA or DQ links may be eliminated and the signals conveyed thereon instead multiplexed on the remaining signaling links (DQ or CA, as the case may be).

As shown, the controller component 101 includes a command interface 110 having the above-mentioned activation mode logic 112 and additionally includes transaction queues 107 and data interface 111. The transaction queues 107 are coupled to receive memory transaction requests from one or more host requestors via host interface 109, and include logic to organize the transaction requests for sequential delivery to command interface 110. Command interface 110 responds to each incoming memory transaction request by generating a sequence of one or more memory commands, transmitting the commands, together with corresponding address values, via one or more command/address (CA) signaling links 102. The commands generated by command interface 110 may generally be categorized as memory commands or configuration commands, with memory commands including, without limitation, row activation commands (including information defining or bearing on the activation mode), column access commands, precharge commands and, if necessary, refresh commands and/or other memory-core management commands. Configuration commands may include, without limitation, register programming commands, including commands for programming activation pattern (or activation mode) values within the activation mode register circuitry 118 of memory component 103, commands for configuring or calibrating timing circuitry and signal transmission/reception circuitry, and so forth.

Still referring to FIG. 1A, data interface 111 transmits and receives data via DQ links 104 in association with respective memory transaction requests, transmitting write data obtained from transaction queues 107 in association with write transaction requests and delivering read data received in connection with read transaction requests to the transaction queues (or buffering circuitry associated with the transaction queues) for eventual output to a host requestor. Data interface 111 may also be used to convey register settings, including activation pattern information, in some embodiments.

Memory component 103 includes a memory core 120 together with command and data interfaces 115 and 117. Command interface 115 is coupled to receive memory access commands and associated addresses from control-side command interface 110 via CA links 102 and issues row and column control signals to memory core 120 as necessary to carry out the commanded operations. Data interface 117 operates as a counterpart to the control-side data interface, outputting read data retrieved from memory core 120 onto DQ links 102 during memory read operations and delivering write data received via DQ links 102 to the memory core for storage during memory write operations.

Memory core 120 includes one or more independently accessible storage banks each containing at least one each of a storage cell array 121, sense amplifier bank 131, row logic 123 and column logic 125. Within each storage cell array 121, rows of storage cells 132 are coupled to respective word lines (WL) and stacks of storage cells are coupled to respective bit lines or pairs of bit lines (BL). Each bit line (or bit line pair) couples the storage cells in a given stack to a corresponding sense amplifier within sense amplifier bank 131 and may additionally extend to the column logic 125. In an alternative embodiment, discussed below, bit line multiplexers may be coupled between core bit lines (i.e., bit lines extending through storage cell array 121 and coupled to respective stacks of storage cells) and the sense amplifier bank 131 to enable a relatively small number of sense amplifiers to be coupled at different times to address-specified segments of a row. For present purposes, each of such row segments may be viewed as a complete row of storage cells in which the activation patterns described herein may be applied.

Still referring to memory component 103, access to individual cells within storage cell array 121 is carried out hierarchically in row and column operations, starting with a row activation operation in which data from cells within an address-specified row are transferred via core bit lines (BL) to sense amplifier bank 131 and latched therein. More specifically, when a row activation command is received within command interface 115, the command interface determines the activation pattern to be applied and delivers activation pattern signals to row logic 123 together with a row address and one or more control signals (collectively, "CA-Row") that trigger decode and sense-enable timing within the row logic. Row logic 123 responds to the control signals by decoding the row address to assert a corresponding one of the word lines (WL), thereby effecting the storage cell selection operation described above (i.e., enabling the storage cells coupled to or otherwise associated with the word line to output data onto respective bit lines). After a predetermined or programmed cell selection interval (e.g., a time period sufficient for data signals to develop at the inputs of the sense amplifier bank and, if necessary, a time period sufficient for bit lines to be driven to a potential corresponding to the operation to be performed), activation pattern logic 124 within row logic 123 asserts sense-enable signals (SE) in a pattern according to activation pattern signals provided by command interface 115 thus enabling data to be sensed and latched in sense amplifier bank 131 according to one of a variety of different activation patterns including, but not limited to, the maximized, clustered, strided and minimized activation patterns shown in FIG. 1B.

After the row activation operation is completed, the activated "page" of data is available for access in a sequence of one or more column operations. More specifically, whichever of the sense amplifiers within sense amplifier bank 131 was enabled to sense and latch a respective data bit contains valid data, while the remaining sense amplifiers do not, thus establishing a page of data that corresponds to the activation pattern. Accordingly, except when a maximized activation pattern is applied, the open page will contain a sparsely or incompletely filled page (i.e., a fraction of the complete row of data specified by the row address) occasionally referred to herein as a clustered, strided or minimized page, as the case may be. Note that a separate word line activation may not be required for each sense amplifier activation. For example, a first set of sense amplifiers may be activated following a word line activation, and a second set of sense amplifiers may later be activated with respect to the same word line activation.

After row activation, the open page may be accessed in a sequence of column operations, with the column address being applied in each instance to select a column of data within the page buffer (i.e., within sense amplifier bank 131). To determine whether a given transaction request resolves to valid data within the page buffer (i.e., a page hit), controller component 101 maintains an "activation image" that indicates the row address and activation pattern applied with respect to each storage bank within the memory component (or multiple memory components in some cases). Thus, when a transaction request is received within controller component 101 (or at some time between receipt of the transaction request and generation of memory access commands corresponding thereto), controller component 101 compares address information provided in or derived from the transaction request with address information within the activation image to determine whether the transaction request hits an open page. If a page miss occurs, controller component 101 issues an activation command to activate the storage cells of interest (preceded by a precharge command if necessary), and then issues one or more column access commands to complete the requested transaction. If a page hit occurs, the controller component may proceed directly with column access, issuing one or more column access commands without first precharging or activating data within the specified storage bank.

Figure 2:
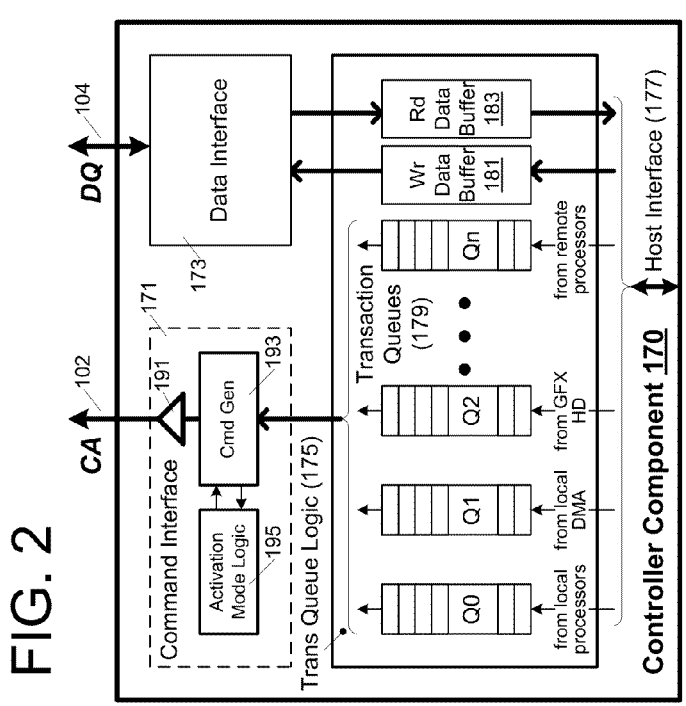
FIG. 2 illustrates a more detailed embodiment of a controller component that may be used to implement the controller component of FIG. 1.

FIG. 2 illustrates a more detailed embodiment of a controller component 170 that may be used to implement the controller component of FIG. 1A. As shown, controller component 170 includes a command interface 171, data interface 173, transaction queue logic 175 and host interface 177. In the embodiment shown, transaction requests received via host interface 177 are distributed among multiple transaction queues 179 within transaction queue logic 175 according to the requesting source and then delivered sequentially (e.g., under control of request arbitration logic, not shown) to command interface 171. Command interface 171 includes a command generator 193 and activation mode logic 195 that operate to generate a sequence of memory access commands (e.g., row activation commands and column access commands) and configuration commands, including activation mode programming commands that specify activation patterns to be applied within one or more attached memory components. Command/address transmitter 191 transmits the memory access commands (including address information) and configuration commands to one or more attached memory components, optionally serializing each command and associated address or configuration value to effect transfer over a number of CA signaling links 102 narrower (i.e., fewer in number) than the number of bits in the command/address value.

Still referring to FIG. 2, data interface 173 includes input/output (I/O) circuitry to transmit write data supplied from a write data buffer 181 within transaction queue logic 175 to one or more attached memory components via DQ links 104 and, conversely, to supply read data received via the DQ links to a read data buffer 183 within the transaction queue logic. Like the command interface, data interface 173 may include serializing circuitry to enable serialized transmission of a relatively wide quantum of data over a relatively narrow number of DQ signaling links (i.e., transmitting portions of a data word via DQ links 104 in successive transmission intervals and thus "bursts" of data) as well as deserializing circuitry to parallelize sequentially received portions of a read data word. Though not specifically shown, transaction queues 179 may include queue management logic to manage the queuing, de-queuing and buffering operations with respect to transaction requests and corresponding read and write data.

FIG. 3 illustrates more detailed embodiments of a command generator 201 and activation mode logic 203 that may be used to implement command interface 171 of FIG. 2. As shown, command generator 201 includes request selector circuitry 205 to select transaction requests from the transaction queues (shown as Q0-Qn) and a command/address sequencer 207 that generates a sequence of command/address values in response to each selected transaction request. The command/address sequencer 207 additionally receives an activation mode value and an activation mode register setting ("applied AMR") from activation mode logic 203 and applies that information in the generation of memory access commands and activation mode configuration commands. Though not specifically shown, one or more configuration registers may be provided within command generator 201 (or circuitry coupled thereto) to enable programmable control over request prioritizing policies (i.e., controlling the order in which requests are selected from different transaction queues) and programmable selection of command conversion operations to support different memory access protocols, page policies and so forth.

In one embodiment, address information provided in (or derived from) the selected request (i.e., the transaction request output by request selector 205 and designated "Req" in FIG. 3) is provided to activation mode logic 203 together with optional tag information that provides additional detail regarding the transaction request. As shown, activation mode logic 203 includes an activation mode register (AMR) selector 209 together with an optional decision engine 211 that cooperate to output activation mode information to the command generator in response to the incoming address and tag information. More specifically, the AMR selector 209 includes control logic 215 to select, via multiplexer 219, the contents of one of multiple AMR registers (AMR0-AMRn–1) within AMR register file 217 to be output to command generator 201 as the applied AMR value, and also outputs an activation mode value that indicates whether the applied AMR value is to be programmed within an attached memory component. As described below, control logic 215 may generate the activation mode value and select the applied AMR value based solely on address information provided within the selected request ("Req"), or may additionally or alternatively rely upon information from other sources, including information provided by decision engine 211.

In one embodiment, activation mode logic 203 determines the activation pattern to be applied in connection with a given transaction request according to the transaction queue that yielded the request and thus according to the nature of the host requestor. For example, as requests from a local DMA (direct memory access) controller tend to be requests to retrieve data in amounts that correspond to whole cache lines or even multiple cache lines (i.e., data from a continuous sequence of column addresses that extend across one or more storage rows within attached memory components), activation mode logic 203 may specify a maximized activation pattern or clustered activation pattern (i.e., with cluster size set to the cache line length) to be applied in row activations triggered by DMA requests. By contrast, because requests from graphics (GFX) or high-definition (HD) video requestors often involve memory access requests that correspond to strided column access patterns (i.e., non-continuous column addresses offset by regular address intervals), activation mode logic 203 may specify various strided activation patterns to be applied in row activations triggered by graphics/high-definition video requests. Yet other patterns, including strided, clustered, minimized or maximized patterns may be applied in connection from requests from other sources, including local or remote processors, application specific integrated circuits of various types and so forth, a number of which are shown for example in the transaction queues 179 of FIG. 2.

Still referring to FIG. 3, groups of activation mode registers (or individual registers) within AMR register file 217 may be associated with respective transaction requestors, with the tag information indicating which logical transaction queue (and thus which transaction requestor) sourced a given transaction request. In one embodiment, decision engine 211 operates on the history of transaction requests from a given source to update the contents of the different activation mode registers associated with that source and thus dynamically adapts the activation mode as the nature of operations (i.e., memory access pattern) from a given transaction requestor change over time. In another embodiment, decision engine 211 operates on pending transaction requests from one or more sources (e.g., requests pending in transaction queues) to update the contents of activation mode registers. In one implementation, for example, decision engine 211 evaluates address values associated with pending memory access requests (e.g., stored within a transaction queue corresponding to a given source) to discern fractional activation patterns that will yield hits with respect to the pending requests (i.e., identifying a strided and/or clustered activation pattern that includes columns corresponding to the pending memory access requests) and updates activation mode registers accordingly. Alternatively (or additionally), the contents of the activation mode registers associated with a given source may be programmed with user or system configuration information 220 to establish predetermined predictions as to the activation modes most suitable for a given class of transaction requestor. In either case, address information provided in the selected transaction request may be used to select individual address mode registers within a group identified by the tag information (and thus updated and identified by the decision engine), thereby establishing a two-tier or two-dimensional activation mode selection: selecting an AMR group within register file 217 according to transaction request source and then selecting a specific AMR within the selected group according to address range, or vice-versa.

In an alternative embodiment, program counter values, instruction identifiers and/or other information that associates transaction requests with programmed instructions that triggered the transaction requests is provided within the tag information and applied within decision engine 211 to identify and dynamically update activation mode registers within register file 217. This approach is particularly useful for discerning strided memory access patterns, as strided addresses often result from computations within a loop (e.g., increment address by some value 'i' on each pass through the loop) and thus from the same memory access instruction within the loop. Accordingly, tracking transaction requests according to instruction identifiers (or program addresses or program counter values provided with respective transaction requests) and evaluating the address history associated with transaction requests corresponding to a given identifier enables detection of strided access patterns and specification of corresponding strided activation modes. This instruction-tracking approach may be combined with the requestor ID and/or address range tracking techniques described above, and embodiments of decision engines that generate instruction-tracked activation modes are described in further detail below.

Figure 4:
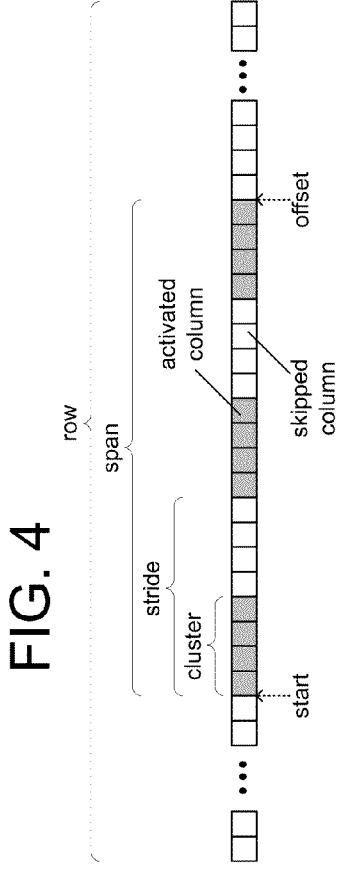
FIG. 4 illustrates a fractionally activated row of storage cells.

FIG. 4 illustrates a fractionally activated row of storage cells together with a number of terms used in connection with embodiments presented herein. First, the overall row of storage cells is organized in columns, including activated columns (shaded) and non-activated or skipped columns (unshaded). While there may be any practicable number of columns per row and storage cells per column, a number of examples described below assume 128 columns per row and 32 bits (four bytes) per column, and thus a 4096 bit (4 Kilobit) row size. The activation pattern within the fractionally activated row is defined by a "span" that extends between a starting column ("start") and an offset location ("offset" or "end") and contains one or more "clusters" of activated columns. In the case of a strided activation pattern, the "stride" is the number of columns between the starting columns of adjacent clusters. Although uniform-size clusters and uniform-length strides are shown in FIG. 4 (i.e., each cluster including four columns, each stride extending across eight columns), patterns having non-uniform cluster sizes and/or non-uniform stride lengths may be supported in some embodiments.

Figure 5:
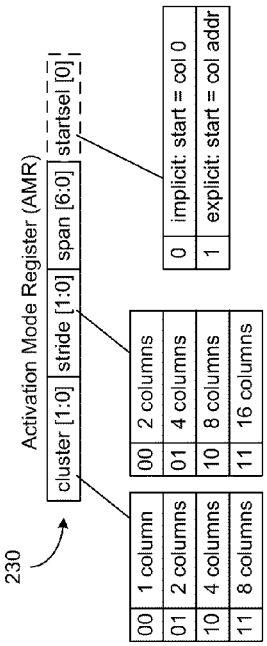
FIG. 5 illustrates an exemplary activation mode register that may be used to encode a variety of activation patterns and that includes cluster, stride and span fields, as well as an optional start-select field.

FIG. 5 illustrates an exemplary activation mode register 230 (AMR) that may be used to encode a variety of activation patterns and that includes cluster, stride and span fields, as well as an optional start-select field ("startsel"). In the embodiment shown, the individual field sizes of the AMR register are limited to achieve a total AMR width that fits within the address field that would ordinarily accommodate a row command (or column command), thus enabling the AMR to be transmitted together with a register-programming operation code in the same command transmission interval that would otherwise be allocated to a row or column command transmission. In alternative embodiments, the individual fields of the AMR may be larger or smaller than those shown, and different and/or additional AMR fields may be provided. In one alternative embodiment, for example, the cluster, stride and span fields each include a number of bits as high as $\log_2 N$, where N is the number of columns of storage cells per row. In another embodiment, the AMR is operated as a column mask register and includes N bits, one bit for each column of storage cells, with each bit set to a high or low logic state (i.e., '1' or '0') to indicate whether the corresponding column of storage cells is to be activated or not.

Returning to the particular implementation shown in FIG. 5, a two-bit cluster field ("cluster [1:0]") defines the cluster size to include one, two, four or eight columns of storage cells, and a two-bit stride field ("stride [1:0]") defines the stride length to be two, four, eight or sixteen columns. Seven bits are allocated to the span field ("span [6:0]") which, assuming a 128 column-per-row memory array architecture, enables specification of a span that ranges from a minimum of one column to a maximum of the entire row (i.e., 128 columns). The optional start-select field includes a single bit to indicate whether the starting column is to be implied or explicitly provided. In the embodiment shown, for example, a start-select value of '0' indicates an implied starting column at the edge of the row, or column 0, while a start-select value of '1' indicates an explicit starting column to be defined by a column address. As discussed below, the latter setting (explicit column-address-specified starting column) may impact operation timing as the row activation operation may be delayed (or deferred) for a period of time sufficient to receive the column address. Also, as discussed below, the start-select value may be specified within the row activation command code instead of being programmed within AMR register 230. That is, a start-select bit field may be allocated in the operation code or argument field of a row activation command to indicate whether the address of the starting column in the row activation pattern is to be implied or explicitly provided, thus obviating the start-select field within AMR register 230.

FIG. 6 illustrates examples of activation patterns that may be achieved by specific settings within the AMR fields of FIG. 5. As shown at 241, a maximized activation pattern (i.e., activating all columns of storage cells within a 128 column row) may be achieved by setting the cluster and stride fields to equal values ("2" columns in the example shown, though settings of 4 columns or 8 columns would also suffice) and by setting the span to 128 columns. In the example shown, the start-selection is set to implicit (i.e., implied starting column address=column 0 in the example presented).

Continuing with FIG. 6, a minimized, single-column activation pattern 243 is achieved by setting the cluster and span to one. The start select field is set to indicate an explicit starting column address and thus that a column address is to be received from the controller component to identify the column of storage cells to be activated. Because the cluster and span fields are equal, only a single cluster is encompassed within the span so that the stride value is ignored and thus shown as 'don't care' ("xx").

A strided activation pattern 245 is achieved by programming a stride greater than the cluster size and a span at least greater than the stride plus the cluster size. In activation pattern 245, the first cluster (a cluster of one column) appears at row 0 due to the implicit start select value, and the stride length of two and span of 128 serve to establish activation of every even numbered column of storage cells (i.e., columns 0, 2, 4, . . . , 124, 126). Another strided activation pattern that extends over a limited span (i.e., less than the complete row of storage cells) and that starts at a column other than column 0 is shown at 247. As in activation pattern 245, the cluster size is set to one and the stride is set to two to establish an alternating pattern of activated an non-activated patterns, in this case starting from an odd-numbered column and ending at column 124, thus effecting a span of 123 columns as specified in the span field.

Examples of single-cluster fractional activation patterns spanning more than one column are shown at 249 and 251. As a matter of terminology, the minimized activation pattern 243 may be viewed as a single-column, single-cluster fractional activation pattern, and maximized activation pattern 241 as a non-fractional (i.e., whole-row) activation pattern and thus both patterns 241 and 243 may be considered specialized cases of clustered activation pattern. By contrast, single-cluster patterns 249 and 251 are fractional, plural-column activation patterns as they span more than one but less than all columns within the row. In the first example 249, the span and cluster size are set to equal numbers of columns (eight in this example) so that the stride value is ignored. In the second example, 251, the desired span of 124 columns is larger than the maximum cluster-size selection permitted within the AMR of FIG. 5 (i.e., eight columns), but by setting the stride equal to the cluster size and both values to a value that is a factor (or divisor) of the span—four, in this example—a continuous set of columns extending from the starting column (specified by an explicit column address in this example) over the length of the span is achieved, and thus a single cluster having a span of 124 columns. Although a positive span is shown in the examples at 259 and 251 and other examples in FIGS. 4-6, a signed span value may be used (or a direction bit that indicates whether span extends toward higher or lower addresses relative to an explicit starting address) to enable specification of a span that extends in a negative direction relative to a column address, effectively establishing the column address as the highest address in the span as shown at 253.

Continuing with FIG. 6, examples of strided activation patterns having plural-column clusters are shown at 255 and 257, in the first example (255) with a cluster size of two and a stride of four over a twelve column span, and in the second example (257) with a cluster size of four and a stride of eight over a span of 120 columns. Thus, in activation pattern 255, three clusters of two columns each are activated, while in activation pattern 257, fifteen clusters of four columns each are activated. Explicit or implicit starting addresses may be used in either case, with an explicit starting address shown for purposes of example in pattern 255 and an implicit starting address shown in pattern 257.

Figure 7:
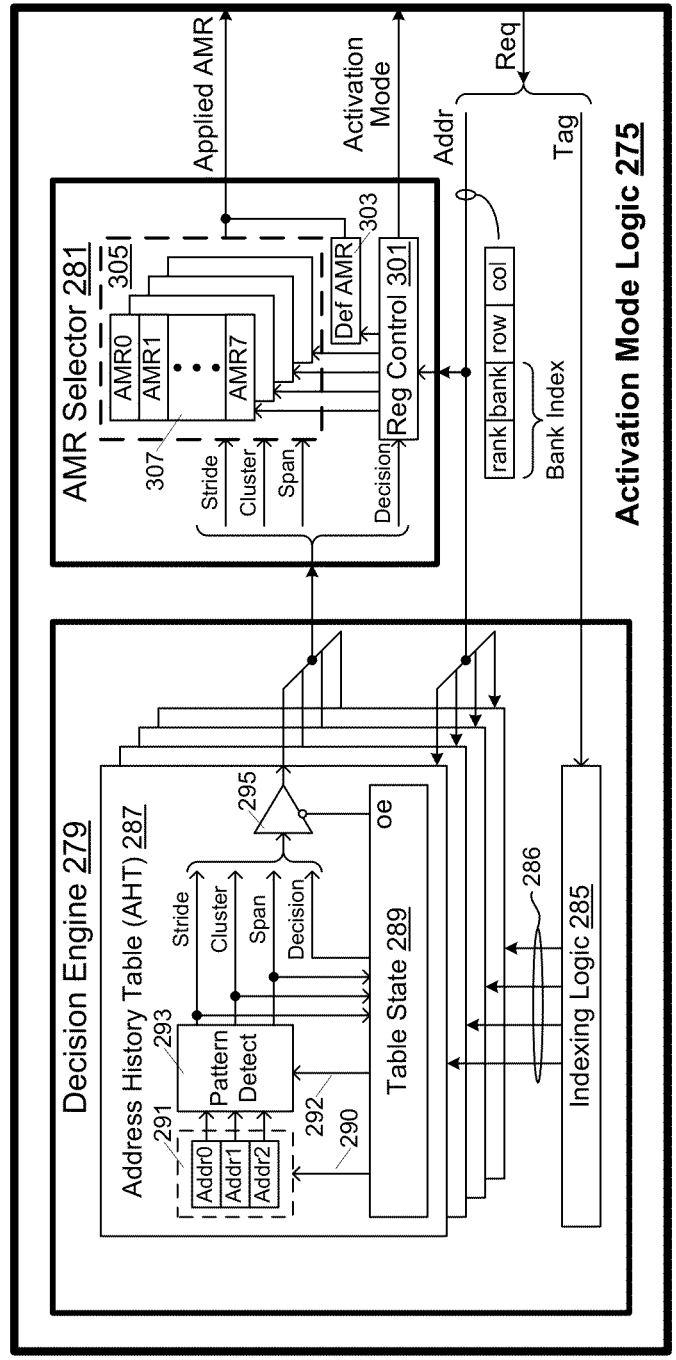
FIG. 7 illustrates a more detailed embodiment of an activation mode logic circuit that may be used to implement the activation mode logic circuits shown in FIGS. 1A, 2 and 3.

FIG. 7 illustrates a more detailed embodiment of activation mode logic 275 that may be used to implement the activation mode logic circuits shown in FIGS. 1A, 2 and 3. Activation mode logic 275 receives address and tag information ("Addr" and "Tag") from a selected transaction request ("Req") and includes an AMR selector 281 and decision engine 279. Decision engine 279 includes indexing logic 285 and a set of address history tables 287 (four in this example) that output respective AMR settings ("Stride," "Cluster" and "Span" values as shown) and decision values ("Decision") to AMR selector 281.

AMR selector 281 includes a number of AMR register files 307 (shown collectively at 305), each corresponding to an independently selectable memory component or rank of memory components. In the embodiment shown, activation mode logic 275 is tailored to application with up to four ranks of memory components (i.e., sets of one or more memory components that are selected as a unit and that output respective portions of a read data value or receive respective portions of a write data value via respective subsets of signaling links within the overall group of DQ links shown in FIG. 1), with the memory components in each rank having up to eight storage banks. Thus, four AMR register files 307 are provided (one for each memory rank) and eight AMR registers, AMR0-AMR7, populate each register file (one for each of the eight storage banks in the corresponding memory rank), with each AMR register within a given register file 307 being used to control and represent the state of a corresponding one of eight AMR registers within a memory component. More or fewer AMR register files and AMR registers per register file may be provided in alternative embodiments to accommodate memory subsystems having more or fewer memory ranks and/or more or fewer storage banks per rank. Also, the number of AMR register files 307 and AMR registers per file may be increased to match the largest anticipated memory rank population and memory bank configuration, with excess AMR register files or AMR registers being unused or allocated to other functions in smaller configurations.

Still referring to FIG. 7, AMR selector 281 also includes a default AMR register 303 that may be programmed with a default activation pattern to be applied if no particular activation pattern is discerned by the decision engine (or if specified by user or system configuration setting). More specifically, register control logic 301 within AMR selector 281 receives the decision value from decision engine 279 and applies that result, together with the address information corresponding to a given transaction request, to select either default AMR register 303 or an AMR register within one of register files 307. In one embodiment, for example, if the decision value indicates that no activation pattern was discerned or identified with respect to the selected transaction request, register control logic 301 enables default AMR register 303 to source the applied AMR and issues an activation mode signal indicating that no memory-side activation mode update is required. By contrast, if the decision value indicates that an activation pattern was identified, register control logic 301 selects one of the register files 307 and AMR registers therein in accordance with rank address and bank address fields within the incoming address information (collectively, the "bank index"), updates the selected AMR register if the decision-result indicates that a new activation pattern has been identified, and enables the selected AMR register to drive the applied AMR output. As discussed below, register control logic 301 also outputs the activation mode value in a state that indicates whether an AMR update has occurred, thus enabling the command generator to issue one or more AMR programming commands as necessary to establish the updated AMR setting within the address-specified memory rank.

Referring again to decision engine 279, indexing logic 285 applies the tag information in each selected transaction request to enable one of the address history tables 287 to generate an updated access pattern determination, and thus an updated activation mode decision. In one embodiment, for example, the tag information includes a program counter value that indexing logic 285 uses to select one of address history tables 287 and enable an activation mode decision therein. More specifically, if the program count value corresponding to the selected transaction request matches the program count value associated with one of address history tables 287, indexing logic 285 asserts a corresponding one of decision-enable signals 286 to enable an activation mode decision within the identified address history table. Table state logic 289 within the identified address history table 287 responds to the asserted decision-enable by loading the incoming address value into an address register ("addr0," "addr1," "addr2") within address buffer 291 and generating an updated activation mode decision based on the new address. In the embodiment shown, for example, the table-state logic first outputs a table-load signal 290 to address buffer 291 (thus enabling the incoming address to be loaded into a register within a circular buffer or other address list structure), then outputs a decision-update signal 292 to pattern detect logic 293 to enable generation of an updated activation pattern. The activation pattern or activation mode output by the pattern detect logic (e.g., a tuple including stride, cluster and span values) is supplied to the table state logic 289 to enable generation of a decision value (as described above) that indicates whether an access pattern has been detected and, if so, whether the pattern indicates an activation mode different from the activation mode presently encoded within the AMR register corresponding to the bank index. After updating the decision value, the table state logic 289 outputs an output-enable signal ("oe") to output circuit 295 (implemented, for example, by a pass-gate) to enable output of the activation mode settings and decision value to AMR selector 275. Note that the address history table may be populated with addresses corresponding pending requests instead of or in addition to completed requests (i.e., such that the history corresponds to a history of received transaction requests instead of or in addition to a history of completed memory accesses). In such an embodiment, the resulting stride span and cluster determinations are determined at least in part based upon addresses that are certain to be applied, thus removing predictability with respect to the activation pattern determination. Thus, regardless of whether the activation pattern is predicted based on a history of completed memory access operations and/or determined without prediction or speculation based on pending memory access requests, the activation pattern is still generated based on addresses associated with memory access operations expected to be executed by the control component.

Figure 8:
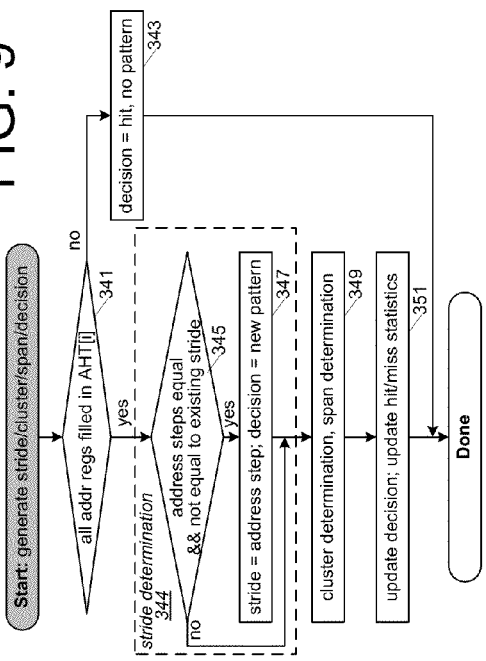
FIG. 8 illustrates an exemplary sequence of operations carried out by the indexing logic and table state logic within the decision engine of FIG. 7 after receiving an address value and program counter value in connection with a selected request.

FIG. 8 illustrates an exemplary sequence of operations carried out by the indexing logic and table state logic within the decision engine of FIG. 7 after receiving an address value (Req.addr) and program counter value (Req.pc) in connection with a selected request. Starting at 321, the indexing logic compares the incoming program counter value, Req.pc, with the program counter value recorded for each of the address history tables (i.e., AHT[i].pc where T is the table index and ranges from 0 to n–1, 'n' being the number of address history tables). If no match is detected, an address-history-table miss (AHT miss) is signaled in the decision value at 323, and the address history table allocation is updated at 325. If the incoming program counter value does match the program counter value associated with an address history table (affirmative determination at 321), an address history table hit has occurred and the indexing logic enables the table state logic within the identified address history table to perform an address-load operation at 327 and pattern update operation at 329 to determine whether the access pattern enables prediction of an activation pattern and, if so, whether the activation pattern prediction is different from the prediction last generated based on information within the indexed address history table. Thus, as shown in decision table 322, at least three outcomes may result from an address history table hit (with a fourth outcome '00' being used to signal an address-history-table miss): first that a hit occurred, but no valid access pattern was discerned and thus no activation pattern predicted ('01'); second that a hit occurred and a valid access pattern was discerned, but the corresponding activation pattern matches that previously generated ('10'); and third that a hit occurred and that a valid access pattern corresponding to a new activation pattern was discerned. In the embodiment shown, these three table-hit outcomes are distinguished by loading the incoming address into an empty or least recently loaded address register within the address buffer at 327 (e.g., the address register within a circular address buffer pointed to by a head-of-list pointer or counter, AHT[i].head_ptr within the table state logic, incrementing the pointer or counter following the address load), then, at 329, generating an access pattern prediction (and thus an activation pattern) and decision value based on the contents of the address registers within the address buffer and asserting the output enable signal for the address history table. The output enable signal for all other address history tables may be deasserted prior to or concurrently with asserting the output enable signal for the indexed address history table, thus effectively multiplexing the decision value and activation pattern from the indexed address history table onto the activation mode/decision input to the command generator. In the event of an address history table miss, the output enable signals of all address history tables may be deasserted and the decision signal lines pulled low or high to signal the miss.

Figure 9:
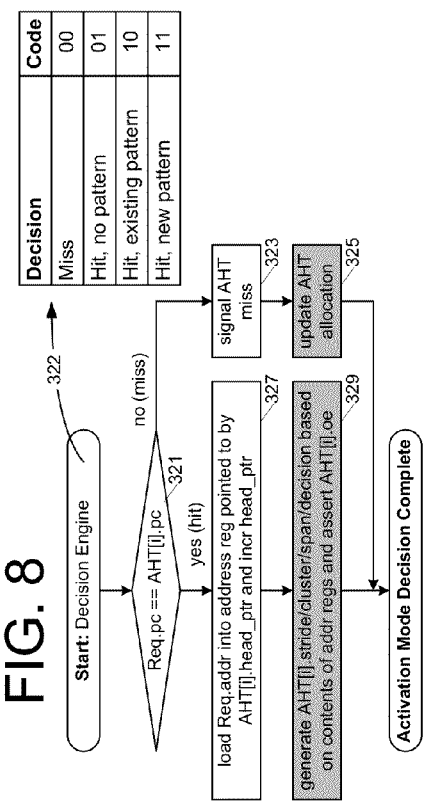
FIG. 9 illustrates a more detailed sequence of operations that may be carried out by the table logic of FIG. 7.

FIG. 9 illustrates a more detailed sequence of operations that may be carried out by the table logic of FIG. 7 to implement operation 329 of FIG. 8, and thus generate an activation mode decision (i.e., activation pattern and decision code) in the event of an address-history table hit. At 341, the table logic evaluates the fill state of the address buffer within the indexed address history table. If any of the address registers is empty, the table logic generates a result code indicating that, despite the address history table hit, no pattern is yet discernible. Otherwise, if all address registers have been loaded, the table logic proceeds with determining stride, cluster and span values at 344 and 349. In the implementation of FIG. 9, for example, the stride is determined by evaluating the difference, or "address steps," between the address values within the address buffer. In a three-register address buffer, for example, the two address steps between the three loaded addresses (i.e., from least recently loaded to next-to-least recently loaded, and from next-to-least recently loaded to most recently loaded) are determined and compared 345. In a uniform-stride embodiment, if the address steps are non-equal (negative determination at 345), the table logic concludes that no stride is present and proceeds to the cluster determination and span determination at 349, potentially to assign a stride value used to achieve a single-cluster size greater than the available cluster sizes specifiable in the cluster field of an AMR (e.g., as shown in FIG. 6 at 251). If the address steps are equal and also equal to the existing stride setting (also a negative determination at 345), the table logic concludes that a valid stride is present, but that the stride is unchanged relative to the stride determination made in the most recent hit on the indexed address history table. Accordingly, unless a change in cluster size or span is determined at 349, the table logic will generate a decision that confirms the table hit, but with no update to the memory access prediction and thus no change to the pre-existing activation pattern (i.e., "Hit, existing pattern" as shown in table 322 of FIG. 8).

In one embodiment, the table logic determines the cluster size and span by maintaining a row map that indicates which columns are accessed in consecutive accesses to a given row (e.g., initially setting cluster size and span to 1). After tracking the access history for a threshold number of consecutive accesses (e.g., 128 consecutive accesses, though a larger or smaller consecutive access threshold may be used), setting a bit in the row map for each accessed column, the row map may be used to update the effective cluster and span to be applied in future accesses. After concluding the stride, cluster and span determinations, the table logic updates the decision value at 351 to indicate whether a valid activation pattern was determined and, if so, whether the pattern matches the existing pattern or represents a new pattern (i.e., encoding the decision value to indicate one of the decisions shown in table 322 of FIG. 8). The table logic also updates table hit/miss statistics that may be used in table allocation decisions as discussed below.

Figure 10:
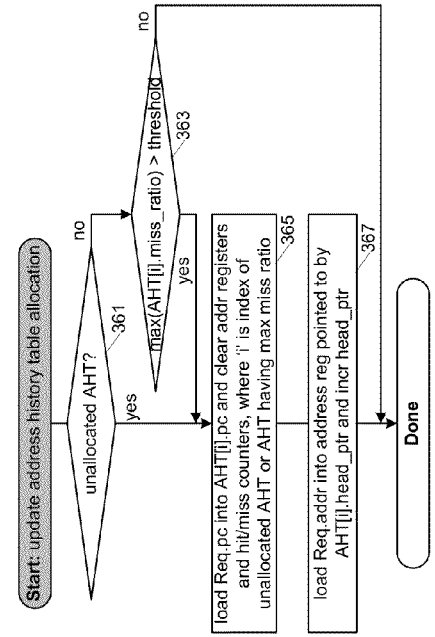
FIG. 10 illustrates an exemplary sequence of operations that may be executed by the table logic of FIG. 7 to update the allocation of address history tables to particular program instructions and thus to particular program counter values following an address-history-table miss.

FIG. 10 illustrates an exemplary sequence of operations that may be executed by the table logic of FIG. 7 to update the allocation of address history tables to particular program instructions and thus to particular program counter values following an AHT miss (i.e., operation 325 in FIG. 8). Initially, the table logic evaluates the current allocation of address history tables at 361 to determine whether an unallocated address history table is available. If so, the table logic carries out the operations at 365 and 367 to allocate the address history table to the memory access instruction corresponding to the incoming program counter value. More specifically, at 365, the table logic loads the incoming program counter value (Req.pc) into the program counter register for the address history table (AHT[i].pc), clears the address registers within the AHT register file (e.g., by setting the registers to invalid address values or otherwise marking the registers as empty), and clears the hit/miss counters for the address history table. At 367, the table logic loads the incoming address value (Req.addr) into the address register pointed to by table-head pointer AHT[i].head (a pointer which may have been reset when the address registers were cleared, or left to arbitrarily point to one of the address registers), and increments the pointer to point to the next address register within the circular buffer, thus concluding the AHT allocation.

Still referring to FIG. 10, if all address history tables are allocated (negative determination at 361), the miss ratio of the address history table having the highest miss ratio is compared against a threshold. In one embodiment, the miss ratio is a ratio of the table hits to table misses for a given address history table and is updated, for example, by the statistic logging operation at 351 of FIG. 9 (with the miss count being incremented for all tables in the event of a complete AHT miss in FIG. 8). In other embodiments, the miss ratio may instead be a metric indicative of the ratio of misses to the total number of decision operations since table allocation, or the ratio of hits to the total number of decision operations since table allocation, or virtually any other metric that indicates the relative value or usefulness of an address history table allocation. In any case, if the miss ratio (or other metric) exceeds a threshold (affirmative determination at 363), the address history table is reallocated to the incoming program counter value, for example, by executing the operations at 365 and 367. Otherwise, no table reallocation occurs.

Figure 11:
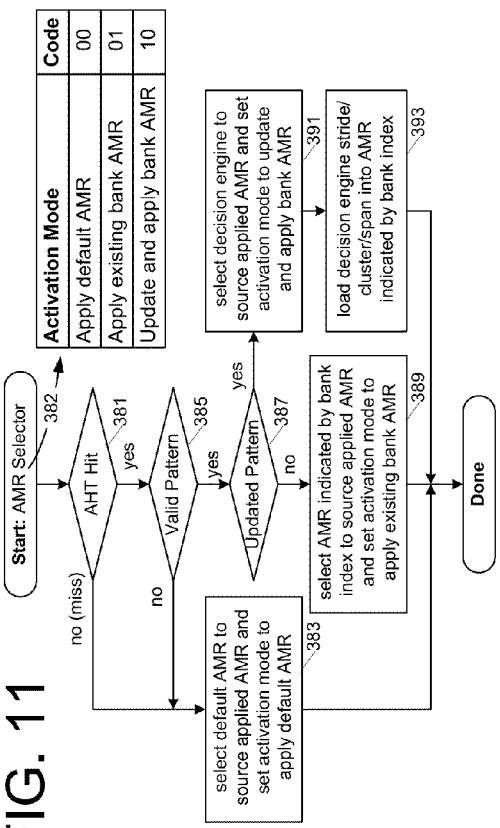
FIG. 11 illustrates an exemplary set of operations carried out by the activation-mode-register selector of FIG. 7 in response to decision value signaled by the decision engine.

FIG. 11 illustrates an exemplary set of operations carried out by the AMR selector of FIG. 7 in response to a decision value signaled by the decision engine. Starting at 381, if the decision value indicates an address history table miss (negative determination at 381), the AMR selector selects the default AMR to source the applied AMR value and sets the activation mode value to apply the default AMR at 383 (e.g., "Apply default AMR: 00" as shown in exemplary AMR mode table 382). The AMR selector performs the same default AMR selection/application operation 383 if the decision result indicates an address history table hit (affirmative determination at 381), but no valid activation pattern is signaled (negative determination at 385). By contrast, if a valid activation pattern is signaled by the decision engine (affirmative determination at 385), the AMR selector carries out operation 389 or the operations 391 and 393, depending on whether the decision engine signals an updated (i.e., revised) activation pattern. If no new activation pattern is signaled (negative determination at 387), the AMR selector performs the operations at 389, selecting the AMR indicated by the bank index (i.e., the rank and bank address fields) of the incoming address value (Req.addr) to source the applied AMR value, and setting the activation mode to apply an existing bank AMR (i.e., "Apply existing bank AMR: 01"). If a new (updated) activation pattern is signaled by the decision engine (affirmative determination at 387), the AMR selector performs the operations at 391, selecting the decision engine to source the applied AMR, and setting the activation mode to indicate that the applied AMR is to be updated and applied within the memory rank and storage bank to which the transaction request is directed (i.e., "Update and apply bank AMR: 10"). As discussed below, the command sequencer responds to this activation mode setting by issuing an AMR programming command to program the applied AMR value within the bank AMR register and rank of memory devices indicated by the bank index portion of the address associated with the selected transaction request, and also issuing an activation command to carry out a row activation using the newly updated bank AMR register. Continuing with FIG. 11, after selecting the AMR source and setting the activation mode at 391, the AMR selector loads the activation pattern fields (e.g., stride, cluster and span in the example shown) into an AMR register of the AMR selector indicated by the bank index as shown at 393, thus updating the image of the value programmed or to be programmed within the attached memory rank.

Figure 12:
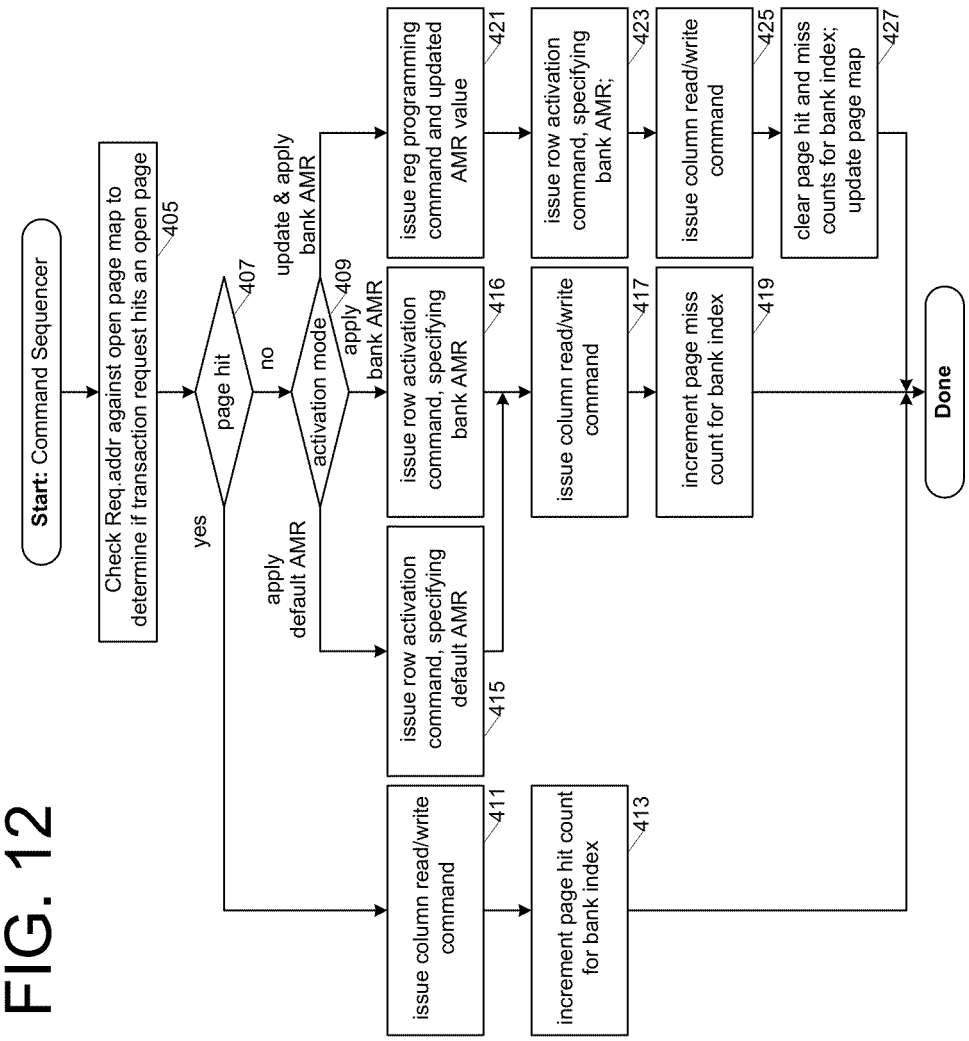
FIG. 12 illustrates an exemplary sequence of operations carried out by the command sequencer of FIG. 3 in response to the transaction request selected during a given transaction cycle, and the applied AMR (activation mode register) and activation mode values supplied by the activation mode logic of FIG. 7.

FIG. 12 illustrates an exemplary sequence of operations carried out by the command sequencer of FIG. 3 in response to the transaction request selected during a given transaction cycle, and the applied AMR and activation mode values supplied by the activation mode logic of FIG. 7. Starting at 405, the command sequencer compares the address provided in the selected transaction (Req.addr) with a table of activated column addresses, referred to herein as an "open page map" (or "activation image" as discussed above) to determine whether the incoming address hits an open page (407). More specifically, after issuing a row activation command, the command sequencer updates an image of the activated columns for each bank of each memory rank to enable rapid page hit/miss determination with respect to subsequently received requests. Accordingly, if a selected transaction seeks to read or write a column of data already activated and present in a page buffer of the memory rank and storage bank indicated by the bank index of the address (a page hit and thus an affirmative decision at 407), the command sequencer need not issue a row activation command and may instead issue a column read/write command without delay as shown at 411. The command sequencer may also increment the page hit count for that bank index at 413, thereby maintaining a statistic that may be useful in address-range based activation mode determinations.

If the address provided in the selected transaction yields a page miss (i.e., column address corresponds to a column of data not activated within the memory rank and storage bank indicated by the bank index, thus yielding a negative determination at 407), then the command sequencer follows one of three courses of action at block 409, depending on the activation mode value supplied by the activation mode logic. First, if the activation mode logic indicates that the command sequencer is to apply the default AMR, the command sequencer issues a row activation command as shown at 415, specifying the default AMR within a register selection field of command. After a row activation delay transpires, the command sequencer issues a column read/write command at 417, and then increments the page miss count for the bank index at 419.

Returning to block 409, if the activation mode indicates that the command sequencer is to apply the bank AMR without update, the command sequencer responds accordingly by issuing a row activation command at 416, specifying within the register selection field that the recipient memory components are to apply the bank AMR corresponding to the bank address provided in the row activation command. Thereafter, the command sequencer performs the operations at 417 and 419, issuing a column read/write command and incrementing the page miss count for the bank index.

If, at block 409, the activation mode indicates that the command sequencer is to both update a memory-side AMR register and apply the updated AMR value, the command sequencer issues a register programming command at 421 together with the updated AMR value (e.g., the applied AMR value supplied by the activation mode logic), thereby instructing and causing the memory devices within the memory rank indicated by the rank address in the selected transaction request to perform a register programming operation to update the contents of the AMR corresponding to the bank address in the selected transaction request. Thereafter, at 421, the command sequencer issues a row activation command, specifying within the register selection field that the recipient memory components are to apply the bank AMR corresponding to the bank address provided in the row activation command. After a predetermined row activation delay, the command sequencer issues a column read/write command at 423, then clears the page hit and miss counts for the bank index and updated the open page map at 427.

As mentioned briefly above, the time at which row activation events are carried out within a memory component may vary depending on whether column address information is needed to finalize the row activation pattern to be applied. More specifically, if the start-select field within a specified activation mode register or row activation command indicates an implicit starting address for the columns spanned by the row activation pattern (e.g., starting column is impliedly column 0), then a commanded row activation operation may be initiated without delay within the memory component. By contrast, if the start-select field indicates an explicit starting column address, then the row activation operation may be delayed (or deferred) pending receipt of the column address information. The start time of the row activation operation may also vary according to whether an AMR update is required.

Reflecting on the memory component embodiments described in reference to FIGS. 14-19 and the exemplary command sequencer operations shown in FIG. 12, it should be noted that activation mode registers may be omitted from memory components in alternative embodiments and the various fractional row activation patterns effected instead in response to pattern definitions provided with row activation commands. In one embodiment, for example, the command decode circuitry within a given memory component may include logic circuitry generate one of a multiple fixed row activation patterns in accordance with a pattern select value (which may be a single bit or multi-bit value) provided within or in association with an incoming row activation command. In one embodiment, for example, an n-bit pattern select value (where n is an integer ≥1) is embedded within an incoming row activation command and decoded by pattern decoder 519 of FIG. 15 to select one of $2^n$ fixed row activation patterns, outputting corresponding activation pattern signals to activation pattern logic within the row logic of the memory component. In another embodiment, pattern decoding circuitry within the memory component synthesizes activation pattern signals on the fly in response to a pattern definition (e.g., an AMR value from the memory controller or other definition of cluster, stride and span values) embedded within or transmitted in association with a row activation command, again avoiding the need for dedicated activation mode registers within the memory component. Where possible, an activation pattern definition or pattern select value may be encoded in whole or part within spare bits (i.e., reserved or otherwise unused bits) of a row activation command. Where insufficient spare bits are available, part or all of the activation pattern definition or pattern select value may be transmitted in a separate transmission over the command/address path (e.g., in an interval immediately following transmission of a row activation command) and/or over other available signaling links.

FIGS. 13A-13C illustrate timing differences between row activation operations having implicitly and explicitly addressed row activation patterns, and between row activation operations that involve and do not involve an AMR register update. More specifically, FIG. 13A illustrates a memory access preceded by an AMR programming operation and that involves an implicit-column-address fractional row activation. FIG. 13B illustrates a memory access preceded by an AMR programming operation, but differing from the operation in FIG. 13A by having an explicit-column-address fractional row activation instead of an implicit-address activation. FIG. 13C illustrates a memory access that involves an explicit-column-address fractional row activation of FIG. 13B, but without an AMR update and thus no up-front AMR programming operation. The timing diagrams in FIGS. 13A-13C illustrate various delays or timing offsets between command, address and data transmissions (e.g., row-to-column delay, $t_{RCD}$, column-to-column delay, $t_{CC}$, column latency $t_{CL}$) as well as specific data burst lengths (BL). The specific delays, timing offsets and data burst lengths shown are presented for purposes of example only. In alternative implementations longer or shorter burst lengths may apply (e.g., BL=1 or 2, or BL=8, 16, 32, etc.), and/or longer or shorter row-to-column delays, column-to-column delays and/or column latency may apply.

Referring to FIG. 13A, during an initial cycle "1" of clock signal, "Clk" (e.g., a clock signal, strobe signal or other timing reference output by the memory controller or other timing reference source), the controller component outputs a programming command ("PR") and AMR value ("AMR") via command/address (CA) signaling links. Note that while the programming command is shown with respect to an operation transmission timeline ("Op") and the AMR value is shown with respect to an address transmission time line ("Addr"), such timelines need not correspond to physical links within the CA signaling links. Instead, the command/address bits that form the programming command and AMR value may be transmitted in any spatial and temporal arrangement over the CA links.

Still referring to FIG. 13A, in the clock cycle immediately following transmission of the register programming command and AMR value (i.e., clock cycle 2), the controller component outputs an activation command ("ACT") and row address ("ROW"), thus triggering a row activation operation within the memory component. As explained above, the activation command may include a bit field to indicate that the newly programmed AMR value is to be applied to define an activation pattern. The activation command may also include a start-select bit field indicating whether an implied start selection or explicit start selection is to be applied in the row activation. Alternatively, a start-select bit field may be included in the AMR value transmitted in clock cycle 1. In the implied start selection example of FIG. 13A, the memory component responds to the activation command by executing a row activation operation in accordance with the AMR value and applying an implied column address (e.g., column address 0) as the starting address of the activated columns. After a row-to-column delay interval, $t_{RCD}$, the controller component outputs a column read command ("RD") and associated column address ("COL") to enable a column access operation with respect to the open or soon-to-be open page. The memory component executes the column access operation, retrieving and outputting a burst of data values (a four-bit long, double-data-rate burst per DQ link coupled to the memory component in the example shown, though shorter or longer burst lengths may apply). As shown, the data output occurs starting in clock cycle eight (after a column-latency interval, $t_{CL}$), thus establishing a net seven-cycle memory access latency after accounting for the activation-mode programming command in clock cycle 1.

A second memory read command (and address) arrives at the memory component a $t_{CC}$ interval (column-to-column interval) after the first (during clock cycle 7), and initiates a second memory read access with respect to the set of columns activated during clock cycles 2-4. Accordingly, a second burst of read data (shaded to correspond to the second memory access command and distinguish the first memory access command and associated data) is output by the memory component a $t_{CL}$ interval after arrival of the second memory access command.

In the explicit-column-address AMR update example of FIG. 13B, a register programming command and AMR value are again issued to the memory component during clock cycle 1, but in this case with either the command or the AMR value specifying an explicit start-select mode for the activation operation. Accordingly, despite receipt of an activation command and corresponding row address during the second clock cycle, row activation is delayed (or deferred) pending receipt of a column address (i.e., the information required to complete the activation pattern definition). In the particular example shown, a column address and column command are supplied in the third clock cycle (i.e., in the clock cycle that immediately succeeds the cycle in which the activation command is supplied and thus back-to-back with respect to the activation command), thereby triggering the row activation operation. Internally, the memory component responds to the explicit start-select mode by delaying for a longer time interval following receipt of the column command before clocking out data, thereby effecting an altered transaction pipeline in which the column command rather than the row command triggers row activation. More specifically, where the column command in FIG. 13A is transmitted a $t_{RCD}$ interval after transmission of the activation command and a $t_{CL}$ interval is imposed between column command arrival and data output, in the embodiment of FIG. 13B, the column command is transmitted with no delay relative to the preceding activation command, but an interval equal to the sum of the $t_{RCD}$ and $t_{CL}$ intervals elapses between column command arrival and data output. Overall, the memory access latency in the explicit-column-address sequence of FIG. 13B is a clock cycle longer than that in FIG. 13A (i.e., with data being output starting in clock cycle 9 instead of clock cycle 8) as the column transmission time elapses sequentially rather than in parallel with the $t_{RCD}$ interval. To limit the latency impact of column-command triggered row activation, the row activation logic may perform a row decoding operation prior to receipt of the column command, mitigating some or all of the delay that results from waiting for the column command.

Still referring to FIG. 13B, a second column command is issued during clock cycle eight and thus with the same data-relative timing as the second column command shown in FIG. 13A. That is, the second column command arrives at the memory component a $t_{CL}$ interval before the corresponding read data is output and thus effects a different command-to-data latency than the first column command (i.e., $t_{CL}$ for the second column command versus a sum of the $t_{CL}$ and $t_{RCD}$ intervals for the first column command). In an alternative embodiment or configuration (or if a different command code is provided to differentiate column commands), the second column command may be issued a $t_{CC}$ interval after the first column command (i.e., in clock cycle 5 instead of clock cycle 8) and exhibit the same command-to-data latency as the first column command, thereby establishing a uniform command-to-data latency from column command to column command for pipeline purposes.

The explicit-column-address fraction row activation of FIG. 13C is essentially the same as that of FIG. 13B except that no AMR programming operation is performed (i.e., fractional row activation re-using previously programmed and applied row activation pattern). Accordingly, the row activation and column read operations, and the ensuing data burst transmission track corresponding activation, column read and data output operations shown in FIG. 13B, but are advanced by a clock cycle (i.e., memory latency is reduced by one clock cycle) due to the omission of the AMR programming operation at the start of the command sequence.

Figure 14:
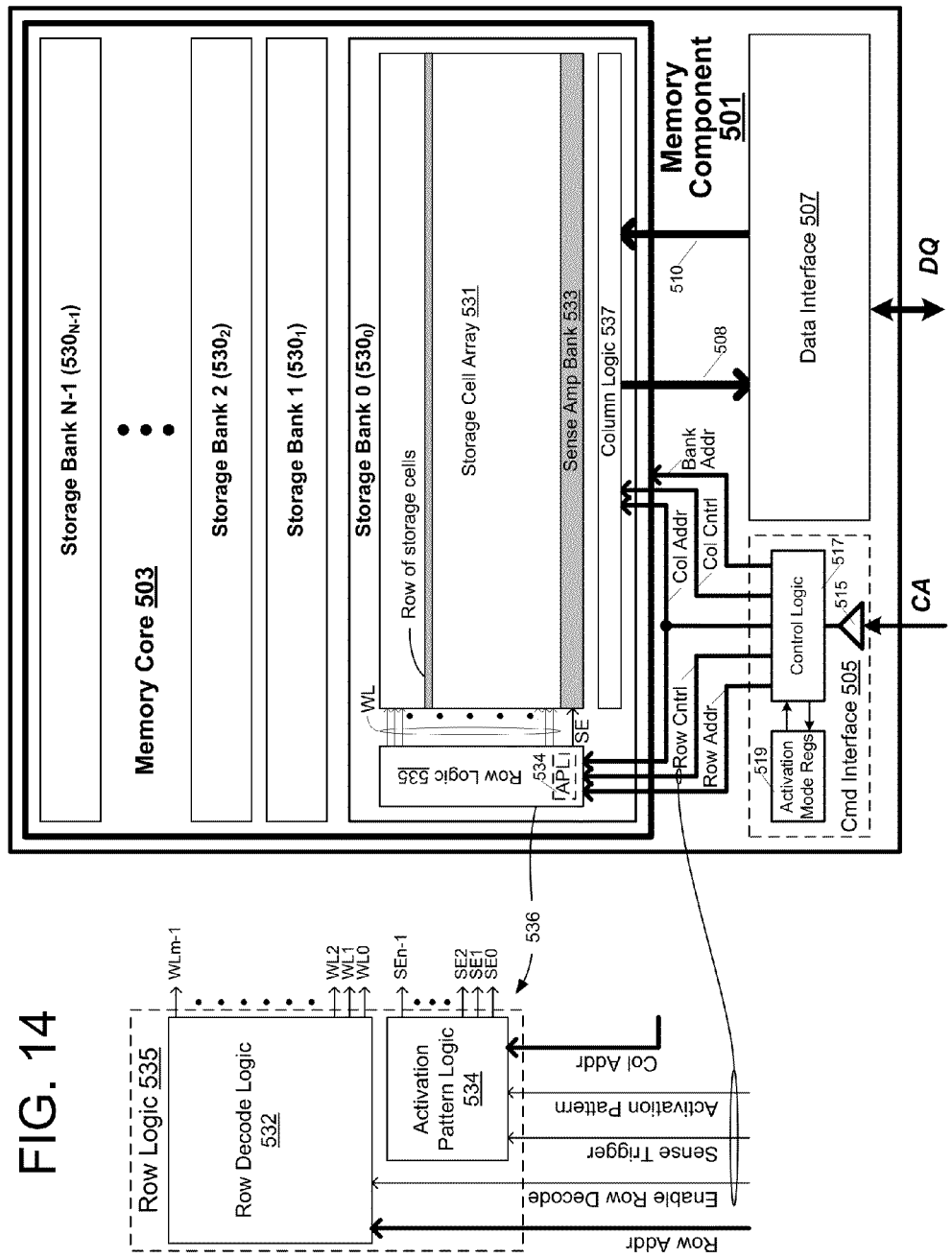
FIG. 14 illustrates a more detailed embodiment of a memory component 501 that may be used to implement memory component of FIG. 1A and thus carry out variably-patterned row activation operations.

FIG. 14 illustrates a more detailed embodiment of a memory component 501 that may be used to implement memory component 103 of FIG. 1A and thus carry out the variably-patterned row activation operations described above. The memory component includes a memory core 503, data interface 507 and command interface 505, each of which operates generally as described in reference to FIG. 1A to carry out memory access and configuration operations commanded by a controller component. Memory core 503 includes N storage banks ($530_0$-$530_{N-1}$), each including a storage cell array 531, sense amplifier bank 533, row logic 535 and column logic 537. Command interface 505 includes receiver 515, control logic and activation mode registers 519, and issues bank address signals that serve to enable row activation and column access operations within a selected storage bank, for example by gating other control signals to enable operations only within the address-specified bank.

Referring to the detail view of storage bank $530_0$, the sense amplifier bank 533 within each storage bank includes a row of sense amplifiers each coupled to a respective stack of storage cells within storage cell array 531 and to column logic 537 via a bit line or pair of bit lines (to avoid obscuring other features, the bit lines are not explicitly shown). Multiplexing circuitry within column logic 537 operates in response to column address signals ("Col Addr") forwarded by control logic 517 to switchably couple an address-selected column of the bit lines to read data output lines 508 or write data input lines 510 during column read and write operations, respectively, thus enabling data read and write transfer between data interface 507 and a selected column of data within sense amplifier bank 533 (i.e., the open page) in response to a column access command. Column control signals ("Col Cntrl") are used to control the timing of events within column logic 537 including, for example, establishing multiplexed data transfer connections with a column-address-specified subset of the sense amplifiers for a bank-address-specified storage bank. Also, while the memory core 503 is depicted as having a separate column logic circuit 537 per storage bank 530, a single column logic circuit may alternatively be coupled via global bit lines to sense amplifier banks 533 within all the storage banks $530_0$-$530_{N-1}$, selecting a bank-address specified one of the sense amplifier banks to receive a column of write data or source a column of read data.

Still referring to the detail view of storage bank $530_0$, row logic 535 is coupled to receive row address signals ("Row Addr"), row control signals ("Row Cntrl") and column address signals ("Col Addr") from control logic 517, and, as shown at expanded view 536, includes row decode logic 532 and activation pattern logic (APL) 534. Row decode logic 532 receives the row address signals and responds to assertion of an enable-decode signal ("Enable Row Decode"—an instance of a row control signal) by decoding the row address and asserting a corresponding one of 'm' word lines (WL0-WLm−1). In one embodiment, the asserted word line switchably couples each storage cell within a row of storage cells to a respective bit line (or pair of bit lines), thus delivering the entire row (or page) of data associated with the word line to the sense amplifier bank 533 of an address-selected storage bank 530. In alternative embodiments, particularly those involving destructive-read memory technologies (e.g., dynamic random access memory), additional decoding logic may be provided within row logic 535 and/or storage cell array 531 to enable a patterned subset of the storage cells within a given row to be coupled to bit lines in accordance with an activation pattern signaled by control logic 517, thus avoiding bit line connection to storage cells that are not to be activated.

Activation pattern logic 534 is coupled to receive activation pattern signals, sense-trigger and column address signals (i.e., collectively forming at least part of the row control signals) from control logic 517 and responds to assertion of the sense-trigger signal ("Sense Trigger") by asserting sense-enable signals SE0-SEn−1 in a pattern corresponding to the activation pattern and column address. More specifically, the column address is applied to establish the starting address of the subset of sense amplifiers enabled to sense data (and thus the start of the span of columns to be activated) if an explicit start-select is specified in an incoming row activation command or as a field in a selected AMR. By contrast, if an implicit-start-select is specified in connection with a row activation operation, activation pattern logic 534 ignores the column address and instead applies an implied, programmed or otherwise pre-determined column address (e.g., column 0) as the starting address of the span of enabled sense amplifiers. In one embodiment, the activation pattern signals ("Activation Pattern") include encoded values that indicate the activation pattern to be applied to effect the stride, cluster and span values encoded within a selected one of activation mode registers 519 or communicated in an incoming activation command. In an alternative embodiment, the activation pattern signals may be fully decoded and thus consist of 'n' different control signals each gated by a bank-select signal and the sense-trigger signal within activation pattern logic 534 to yield a corresponding one of the 'n' sense-enable signals, SE0-SEn−1.

FIG. 15 illustrates a more detailed embodiment of a command interface 550 that may be used to implement command interface 505 within the memory component of FIG. 14. As shown, command interface 550 includes signal receiver 555, control logic 551 and activation mode registers 553. Control logic 551 decodes incoming memory access command/address values received via receiver 555 (and thus via one or more CA signaling links) to generate row and column control signals ("Row Cntrl," "Col Cntrl") and to forward bank, column and row addresses to the memory core generally as described in reference to FIG. 14. Control logic 551 also receives various configuration commands, including commands that establish operating modes (e.g., delay intervals to be applied in connection with various events, signal termination modes and settings, read/write data burst lengths, data and/or command interface widths configurations and so forth) as well as AMR programming commands used to specify various patterned activation modes as described above. More specifically, control logic 551 responds to an AMR programming command by forwarding the associated AMR value (i.e., "Incoming AMR Value") to activation mode registers 553, driving a set of AMR selection signals ("AMR Selection") to specify the AMR register to be programmed, and asserting an AMR load signal ("AMR Load") to enable an AMR register load operation. The activation mode register includes a load-register selector 561 to route the AMR load signal to the load-enable input of an activation mode register (i.e., one of 'm' activation mode registers within AMR register file 560) specified by the AMR selection signals, thereby loading the incoming AMR value into the AMR register indicated by the AMR programming command.

When a row activation command is received, the control logic asserts the AMR selection signals in a state corresponding to the AMR register indicated within the incoming command and/or bank address to select, via AMR output selector 563, the contents of the specified AMR register as the AMR value to be applied in connection with the commanded row activation operation. In one embodiment, the selected AMR value is output without change (i.e., as activation pattern signals, "Activation Pattern") to activation pattern logic within the row logic of the selected bank which, in turn, generates sense-enable signals that correspond to the specified activation pattern. In an alternative embodiment, the selected AMR value is partially or fully decoded by a pattern decoder 519 within control logic 551 (which may alternatively be disposed within the activation mode register logic or elsewhere within the memory component) to generate the activation pattern signals.

FIG. 16 illustrates exemplary command formats corresponding to commands that may be decoded and operated upon by the control logic of FIG. 15. As shown, each command format may be logically partitioned into separate bit fields including an operation code field ("op"), an argument field ("Arg"), and an address/parameter field ("Addr/Par"). When the operation code field indicates a register programming operation ("Prog Reg"), the argument field conveys a register identifier ("Reg ID") and the address/parameter field conveys the value to be programmed within the identified register. FIG. 17 illustrates an exemplary register ID encoding that enables specification of one of eight bank activation mode registers (i.e., assuming an eight-bank memory component, though more or fewer banks and thus more or fewer bank AMRs may be provided), a default AMR, and up to seven other registers (e.g., one or more mode registers to be programmed with various delay control settings, burst length settings, interface-width settings, or other configuration or control values).

Continuing with the exemplary command formats, when the operation code field indicates an activation operation, the argument field conveys register-select and start-select values ("RegSel" and "StartSel"), and the address/parameter field conveys bank and row addresses and thus the bank index of the storage row to be activated. In one embodiment, the register-select value is a single bit value that indicates whether a bank AMR or the default AMR is to be selected to source the activation mode setting (i.e., the "Selected AMR Value" supplied to control logic of FIG. 15 and used to generate the activation pattern signals). If a bank AMR is to source the activation mode setting, the control logic generates the AMR selection signals in accordance with the bank address within the address/parameter field to select the AMR register for the addressed bank. If the default register is specified, the control logic of FIG. 15 generates the AMR selection signals to select the default AMR (e.g., in accordance with the register ID encoding shown in FIG. 17) and without regard to the bank address. The value conveyed in the start-select field indicates whether an implicit or explicit starting column address is to be applied in the row activation operation, thus specifying one of the different event timelines shown, for example, in FIGS. 13A and 13B.

Still referring to FIG. 16, if the operation code field indicates a column read or write operation, the argument field conveys a read/write value indicating whether a read or write is to be transacted, and a precharge field indicating whether a precharge operation is to be executed at the conclusion of the column transaction (i.e., whether to auto-precharge or not). The address/parameter field conveys the bank address and column address of the storage bank and column of data to be read or written.

If the operation code field indicates a precharge operation, the argument field may indicate whether the precharge operation follows a read or write operation (thus indicating any delay that may be imposed relative to previously commanded or yet-to-be commanded operations), and the address/parameter field indicates the storage bank to be precharged.

FIG. 18 illustrates an exemplary sequence of operations carried out in by control logic 551 of FIG. 15 in response to incoming commands formatted as shown in FIG. 16. Starting at decision block 581, if the operation code indicates a register programming operation, the control logic loads the register value (conveyed in the address/parameter field, for example) into the register indicated by the register ID field as shown at 583, thereby concluding the commanded operation. As discussed above, register programming may involve programming of bank AMR registers as well as the default AMR register, mode registers or any other programmable register.

If the operation code indicates an activate operation (negative determination at 581, affirmative determination at 585), the control logic either immediately executes the activation operation or defers the activation operation pending receipt of a column address depending on whether the start-select field indicates an explicit or implicit column address. More specifically, if the start-select field indicates an explicit column address, the control logic sets a deferred-activate flag ("DefAct") for the address-specified bank and stores the register select value for deferred application as shown at 589. If the start-select field indicates an implicit column address, the control logic issues control and activation pattern signals as shown at 591 to activate the address-specified row (within the address-specified storage bank) in accordance with the AMR register indicated by the register select and the implied column address (e.g., column 0).

Still referring to FIG. 18, if the operation code indicates a column read/write operation (i.e., affirmative determination at 593 and negative determinations at 581 and 585), the control logic evaluates the deferred-activation flag at 595 to determine whether an activation operation is to be performed in advance of the commanded column access. If the deferred-activation flag is set, the control logic issues control and activation pattern signals as shown at 599 to activate the address-specified row, selecting the AMR register indicated by the previously stored register select value (in conjunction with the incoming bank address) to control activation pattern signal generation and supplying the column address to the row logic to define the starting point of the span to be activated. After a row activation delay transpires, the control logic executes the commanded read/write operation as shown at 601. Returning to decision block 595, if the deferred activation flag is not set, the control logic may proceed with the commanded column access without delay as shown at 597.

If the operation code indicates a precharge operation (i.e., affirmative determination at 603 and negative determinations at 581, 585 and 593), the control logic executes the precharge operation with respect to the address specified bank as shown at 605.

It should be noted that the different operation codes shown in FIG. 18 are intended to be illustrative and not exhaustive. Numerous other operation codes may be issued by the control component and acted upon by control logic within the memory component, and in all such cases, different argument fields and address/parameter fields may apply. Also, various levels of indirection may be employed in selecting the AMR register to be applied in connection with a given row activation operation. In one embodiment, for example, a set of bank-indexed registers or register fields (i.e., selected according to an incoming bank address) contain respective AMR pointer or identifier values with each such AMR pointer value specifying a particular AMR register within a set of AMR registers. When a row activation command is received, the bank address associated with the row activation operation is used to index the bank-indexed register set, and thereby obtain a pointer to the AMR register to be applied in the row activation operation. Under this arrangement, any two or more of the bank-indexed registers may point concurrently to the same AMR register, avoiding the need to duplicate a given AMR register setting in a separate storage for each bank (e.g., there may be fewer or more AMRs than storage banks). Also, the AMR register indicated by a bank-indexed register may stand as a default selection in the absence of an explicit AMR register selection within an incoming row activation command. That is, if the incoming command lacks an explicit AMR register selection, the AMR register indicated by the bank-indexed register is applied in the row activation operation. If the incoming command includes an explicit AMR register selection, the default is effectively overridden and the explicitly indicated AMR register is applied in the row activation operation.

As briefly mentioned above, bit lines within a given storage bank may be multiplexed to enable a relatively narrow sense amplifier bank to service substantially wider storage rows. This arrangement tends to be particularly beneficial where the sense amplifier footprint is substantially wider than a single stack of storage cells, as the sense amplifier area is effectively spread across the die area corresponding to the multiplexed number of bit lines and the stacks of storage cells coupled thereto.

Figure 19:
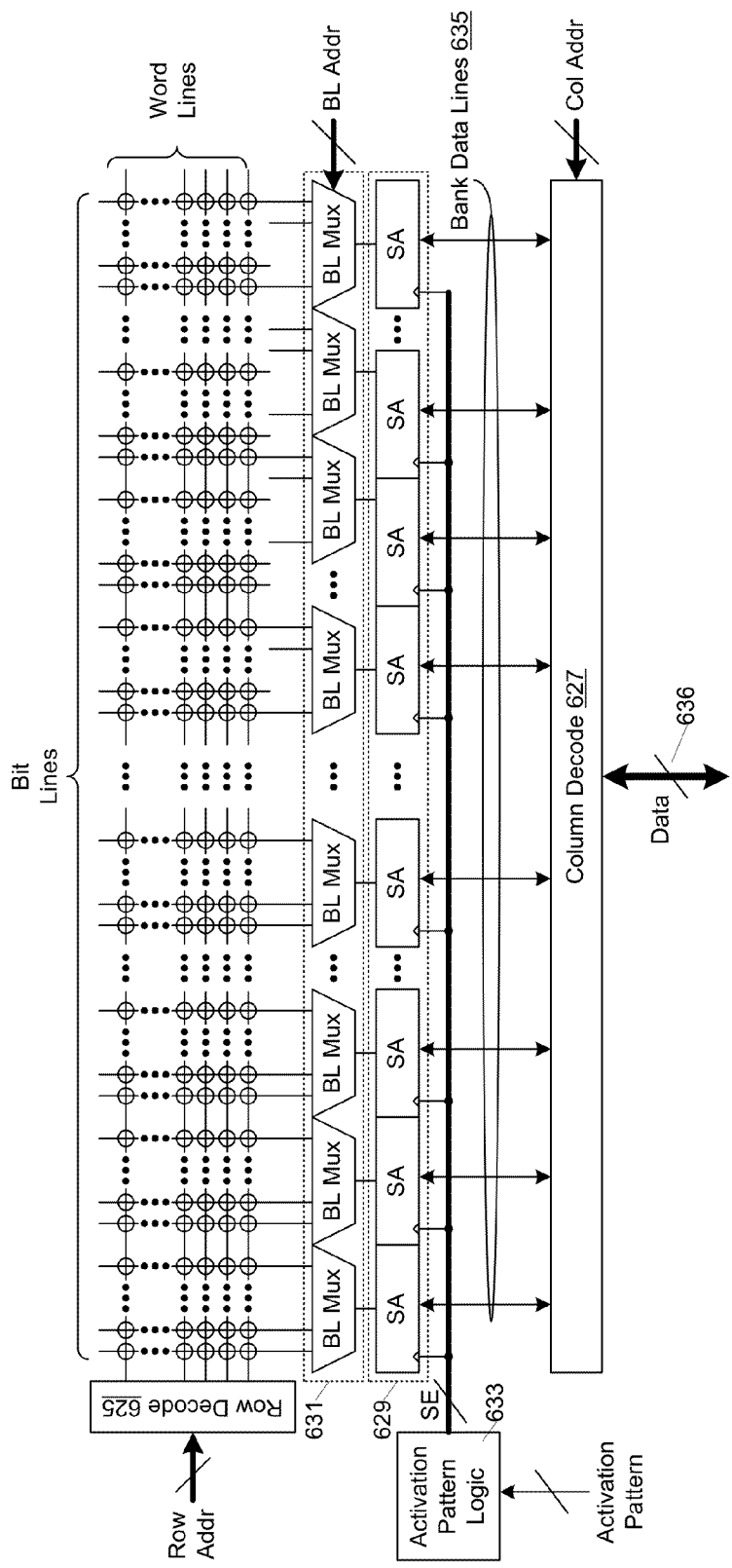
FIG. 19 illustrates a bit-line-multiplexed memory architecture in which individual sense amplifiers in a sense amplifier bank may be switchably coupled to one of multiple bit lines and thus to one of multiple storage cells selected by an asserted word line.

FIG. 19 illustrates a bit-line-multiplexed memory architecture in which each sense amplifier ("SA") in sense amplifier bank 629 may be switchably coupled, via a respective bit-line multiplexing element ("BL Mux"), to one of multiple bit lines and thus to one of multiple storage cells selected by an asserted word line. A bit-line address ("BL Addr") is supplied to the bit-line multiplexers (collectively shown at 631) to control the bit line selection, thus enabling selection of an address-specified subsection of a row, or "subrow" to be coupled to sense amplifier bank 629. As in embodiments described above, a row decoder 625 decodes an incoming row address to assert one of multiple word lines, and activation pattern logic 633 issues sense-enable signals ("SE") to enable bit line sense operations in selected sense amplifiers in accordance with activation pattern signals provided from the control logic. Data is transferred between data I/O lines 636 and a column-address-specified subset of enabled sense amplifiers via bank data lines 635 and column decoder 627.

From the perspective of a controller component, the bit line address (BL Addr) may be viewed as a portion of the row address, and the subrow selected by the combination of the row address and bit-line address as the row to be activated. Accordingly, the above-described activation mode logic within the control component and activation mode register circuitry within the memory component may operate within the subrow (i.e., enabling patterned activation of selected storage cells within the subrow) in generally the same manner as in a full row of storage cells.

Still referring to FIG. 19, in an alternative embodiment the bit line multiplexer could be selectively controlled to establish different activation patterns (i.e., enabling some multiplexers to pass signals to the sense amplifiers and disabling others from doing so), thereby avoiding the need for patterned sets of sense amplifier enable signals and potentially reducing the number of sense amplifiers required.

FIGS. 20-22 depict exemplary memory systems and structures in which control and memory components according to the embodiments above may be deployed. FIG. 20, for example, illustrates a memory module 650 having one or more ranks of patterned-activation memory components disposed thereon. In the embodiment shown, respective ranks of memory components, each including a respective set of 'n' patterned-activation memory components $651_0$-$651_{n-1}$, are disposed on each face of the memory module (i.e., on opposing surfaces of the module substrate, only one of which is shown), thus establishing two memory ranks per memory module 650. As shown, individual sets of data links, DQ0-DQn−1, are coupled to respective memory components of a given rank, and a common set of CA links is coupled to all the memory components of a given rank. Each set of data links may be coupled in common to counterpart memory components within the two ranks (e.g., memory components disposed back-to-back and separated by the module substrate), or separate sets of data links may be provided for each rank. Similarly, separate sets of CA links may be provided per rank, or the CA links shown may be coupled to all ranks of memory components on memory module 650. In either case, the CA links may include a set of chip-select signals to carry rank-address information and thus allow selection of individual ranks. In such an embodiment, the chip-select signals may be routed commonly to the memory components of each rank (e.g., with distinct rank ID values programmed or otherwise established within the components of each rank being used to enable selection of one rank or another), or the chip select signals may be routed individually to the different ranks, for example, with each chip-select signal being coupled to a respective rank to enable exclusive selection thereof.

As shown at 656, each of the individual memory components disposed on memory module 650 may be implemented with a command interface 663 that includes activation mode register circuitry ("AMR") according to the various embodiments described above, as well as a data interface 665 and memory core 661. When deployed within a memory system, a variable number of memory modules 650 may be coupled to a controller component, for example, through removable insertion of one or more memory modules into connector sockets that are coupled via circuit board traces cables or other wired or wireless interconnects to a memory controller disposed on a motherboard or other system structure. In the embodiment shown at 668, for example, such an expandable memory system is populated by two memory modules 650-0 and 650-1, each having two ranks of memory components disposed thereon and coupled via DQ and CA links (collectively shown at 653) to controller component 652.

FIG. 21 illustrates an alternative embodiment of a memory module 680 having patterned-activation memory components. In contrast to the embodiment of FIG. 20, memory components $685a_0$-$685a_n$ and $685b_0$-$685b_n$ (collectively, 685) are not directly coupled to receive command/address and data signals via edge connectors (i.e., elements 670 of FIG. 20), and instead are coupled to a buffer integrated circuit 683 (or buffer-on-board) that acts as an intermediary between the memory components and a controller component. More specifically, the buffer IC 683 receives command/address values via a set of module command/address links ("CAm") and distributes the command/address signals to address-specified groups of memory components 685 (or, alternatively, to all memory components 685 or to a single one of memory components 685).

In one embodiment, buffer IC 683 includes activation mode logic 684 that operates similarly to the activation mode logic described above in reference to embodiments of controller components. Upon specifying an activation pattern to be applied within one or more ranks of attached memory components, buffer IC 683 may transmit pattern identification information to the memory controller component to enable the controller component to track the patterns of open memory pages (i.e., enabling the controller component to ascertain whether an incoming memory access request hits or misses an open page and schedule precharge and activation commands accordingly). In an alternative embodiment, activation mode logic 684 is omitted from (or disabled within) buffer IC 683 which, instead, forwards activation mode commands (e.g., AMR programming commands, and/or memory access commands that specify activation modes) to attached memory components.

FIG. 22 illustrates a set of patterned-activation memory components 701 and a controller component 703 implemented in respective IC dies and disposed in a stacked-die configuration 700. In the particular embodiment shown, each of the memory components 701 includes a memory core 703, data interface 705 and command interface 707 (including activation mode register circuitry 708) that operate as generally described above, and is interconnected to the controller component 703 by a through-silicon via (TSV) array 709. TSV array 709 effects a set of DQ and CA signaling links that extend over a relatively short distance corresponding to the height of the stacked-die configuration and thus short signal flight-time delays (or propagation delays) in comparison to relatively long flight-time delays for DQ and CA signaling links extended over printed circuit board traces or the like. The fine I/O pitch enabled by TSV array 709 may also permit relatively wider DQ and CA interfaces (potentially obviating serializing/deserializing logic within the command and/or data interfaces). In other embodiments, wire bonds, cables, contactless I/O or other types of interconnects may be used to establish chip-to-chip communications instead of the TSV array shown. Also, the individual dies may be disposed within a single package (e.g., as in a system-in-package or multi-chip module), or in separate interconnected packages (e.g., package-on-package, package-in-package).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process. In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. An address or other value provided "in" or "with" a command may be transmitted concurrently (i.e., at least partly overlapping in time) with a group of bits containing a command code or identifier, or prepended, appended or otherwise transmitted in association with the command code or identifier. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a memory component, the method comprising:
    asserting a control signal on a word line to switchably conduct data signals from at least a portion of a row of storage cells to respective sense amplifiers; and
    enabling a selected fraction of the sense amplifiers to latch a corresponding fraction of the data signals, the selected fraction of the sense amplifiers corresponding to one of a plurality of different activation patterns, including at least one pattern that activates sense amplifiers corresponding to non-contiguous column addresses within the row of storage cells.

2. The method of claim 1 further comprising receiving a value indicating the one of the plurality of different activation patterns.

3. The method of claim 2 wherein enabling a selected fraction of the sense amplifiers to latch a corresponding fraction of the data signals comprises identifying the selected fraction of the sense amplifiers based, at least in part, on the value indicating the one of the plurality of different activation patterns.

4. The method of claim 1 wherein receiving the value indicating the one of the plurality of different activation patterns comprises, receiving at least a portion of the value indicating the one of the plurality of different activation patterns as a field of one or more bits within a row activation command.

5. The method of claim 4 further comprising receiving a row address in association with the row activation command, and wherein asserting the word line to switchably conduct data signals from the row of storage cells to respective sense amplifiers comprises asserting one of a plurality of word lines within the memory component that is uniquely identified by the row address.

6. The method of claim 4 wherein receiving at least a portion of the value indicating the one of the plurality of different activation patterns as a field of one or more bits within a row activation command comprises receiving, in association with the row activation command, one or more bits that enable selection of one of a plurality of activation mode registers containing respective activation pattern values, the one of the plurality of activation mode registers containing an activation mode value that, at least in part, defines the one of the plurality of different activation patterns.

7. The method of claim 4 indicating wherein receiving at least a portion of the value indicating the one of the plurality of different activation patterns as a field of one or more bits within a row activation command comprises receiving, in association with the row activation command, one or more bits that indicate a starting location, within the row of storage cells, of a fraction of the row of storage cells corresponding to the one of the plurality of different activation patterns.

8. The method of claim 7 wherein asserting the word line and enabling the selected fraction of the sense amplifiers constitute constituent operations of a row activation operation, the method further comprising delaying execution of the row activation operation until a column address is received within the memory component if the one more bits that indicate the starting location of the fraction of the row of storage cells indicate that the starting location is specified by the column address.

9. The method of claim 1 wherein enabling the selected fraction of the sense amplifiers to latch a corresponding fraction of the data signals comprises asserting first and second sense-enable signals while deasserting a third sense-enable signal, wherein the first and second sense-enable signals are provided to first and second sense amplifiers within the selected fraction of the sense amplifiers and the third sense-enable signal is provided to a third sense amplifier excluded from the selected fraction of the sense amplifiers, the first and second sense amplifiers being coupled to first and second storage cells within the row of storage cells, and the third sense amplifier being coupled to a third storage cell within the row of storage cells.

10. The method of claim 9 wherein the third storage cell is disposed between the first and second storage cells within the row of storage cells.

11. The method of claim 1 wherein the one of the plurality of different activation patterns corresponds to a predicted pattern of memory access operations directed to the row of storage cells.

12. A memory component comprising:
a row of storage cells coupled to a word line;
a bank of sense amplifiers coupled to the row of storage cells;
row decode circuitry to assert a control signal on the word line to enable data signals to be output from the storage cells within at least a portion of the row of storage cells to respective sense amplifiers within the bank of sense amplifiers; and
pattern logic to enable a selected fraction of the sense amplifiers to latch a corresponding fraction of the data signals, the selected fraction of the sense amplifiers corresponding to one of a plurality of different activation patterns, including at least one pattern that activates sense amplifiers corresponding to non-contiguous column addresses within the row of storage cells.

13. The memory component of claim 12 further comprising a command interface to receive a value indicative of the one of the plurality of different activation patterns.

14. The memory component of claim 13 further comprising a plurality of activation mode registers to store values corresponding to respective memory access patterns, and wherein the command interface to receive a value indicative of the one of the plurality of different activation patterns comprises circuitry to receive a value indicative of one of the plurality of activation mode registers.

15. The memory component of claim 14 further comprising circuitry to select the one of the values corresponding to respective memory access patterns stored within the one of the plurality of activation mode registers to be an applied activation mode register value and to generate activation pattern signals based, at least in part, on the applied activation mode register value, and wherein the pattern logic includes circuitry to enable the selected fraction of the of the sense amplifiers in response to the activation pattern signals.

16. The memory component of claim 12 wherein the pattern logic to enable a selected fraction of the sense amplifiers comprises circuitry to assert first and second sense-enable signals and to concurrently deassert a third sense-enable signal, the first and second sense-enable signals being provided to first and second sense amplifiers within the selected fraction of the sense amplifiers and the third sense-enable signal being provided to a third sense amplifier excluded from the selected fraction of the sense amplifiers, the first and second sense amplifiers being coupled to first and second storage cells within the row of storage cells, and third sense amplifier being coupled to a third storage cell within the row of storage cells.

17. The memory component of claim 16 wherein the third storage cell is disposed between the first and second storage cells within the row of storage cells.

18. The memory component of claim 12 wherein the pattern logic to enable the selected fraction of the sense amplifiers corresponding to one of the plurality of different activation patterns comprises logic to predict a pattern of memory access operations that corresponds to the one of the plurality of different activation patterns.

19. A memory component comprising:
a row of storage cells;
a plurality of sense amplifiers;
means for asserting a control signal on a word line to switchably conduct data signals from the row of storage cells to the sense amplifiers; and
means for enabling a selected fraction of the sense amplifiers to latch a corresponding fraction of the data signals, the selected fraction of the sense amplifiers corresponding to one of a plurality of different activation patterns, including at least one pattern that activates sense amplifiers corresponding to non-contiguous column addresses within the row of storage cells.

* * * * *